United States Patent [19]

Miyasaka et al.

[11] Patent Number: 5,307,109
[45] Date of Patent: Apr. 26, 1994

[54] METHOD AND APPARATUS FOR PROCESSING PHOTOSENSITIVE MATERIAL

[75] Inventors: Eiji Miyasaka; Masayuki Handa; Morihiro Takeda; Hiroyuki Tsujino, all of Hikone, Japan

[73] Assignee: Dainippon Screen Mfg. Co., Ltd., Japan

[21] Appl. No.: 780,766

[22] Filed: Oct. 22, 1991

[30] Foreign Application Priority Data

| Oct. 23, 1990 | [JP] | Japan | 2-285179 |
| Oct. 25, 1990 | [JP] | Japan | 2-290292 |
| Nov. 27, 1990 | [JP] | Japan | 2-327325 |
| Nov. 27, 1990 | [JP] | Japan | 2-327326 |
| Nov. 27, 1990 | [JP] | Japan | 2-327327 |
| Nov. 27, 1990 | [JP] | Japan | 2-327328 |
| Mar. 29, 1991 | [JP] | Japan | 3-093671 |

[51] Int. Cl.$^5$ .............................. G03D 3/02
[52] U.S. Cl. ...................... 354/320; 354/324
[58] Field of Search ............ 354/298, 299, 319–324, 354/331, 339, 325

[56] References Cited

U.S. PATENT DOCUMENTS

| 3,776,438 | 12/1973 | Calberg | 225/93 |
| 3,839,040 | 10/1974 | Goldstein . | |
| 4,300,828 | 11/1981 | Kaufman | 354/322 |
| 4,371,250 | 2/1983 | Wakabayashi et al. | 354/325 |
| 4,737,810 | 4/1988 | Kobayashi et al. | 354/317 X |
| 4,837,131 | 6/1989 | Kobayashi et al. | 354/322 X |

FOREIGN PATENT DOCUMENTS

| 0257790 | 7/1987 | European Pat. Off. . |
| 2-79836 | 9/1988 | Japan . |
| 2-79842 | 9/1988 | Japan . |
| 2-79844 | 9/1988 | Japan . |

Primary Examiner—D. Rutledge
Attorney, Agent, or Firm—Ostrolenk, Faber, Gerb & Soffen

[57] ABSTRACT

The invention provides an apparatus for processing silver salt photosensitive material with a small amount of processing solution. The processing solution uniformly reacts with the photosensitive material for maintaining high processing quality.

The apparatus of the invention includes: a process tank 96 which is relatively small in volume; and a developer supply roller 98 which is partly soaked in the processing solution. New or unused developer is temporarily stored in a temporary reservoir 100 formed on the circumference of the roller, held in pores of sponge formed on the surface of the developer supply roller, and supplied to an inlet of photosensitive material PM in the process tank 96 with rotation of the roller 98. The new processing solution is uniformly diffused, along the width of the photosensitive material PM, in the vicinity of the inlet in the stored processing solution. Accordingly, the photosensitive material PM is evenly and efficiently processed.

The invention allows smaller equipment as well as improvement of processing quality. Furthermore, the smaller volume of processing solution prevents accumulation of sludge, thus saving time and labor for maintenance.

20 Claims, 17 Drawing Sheets

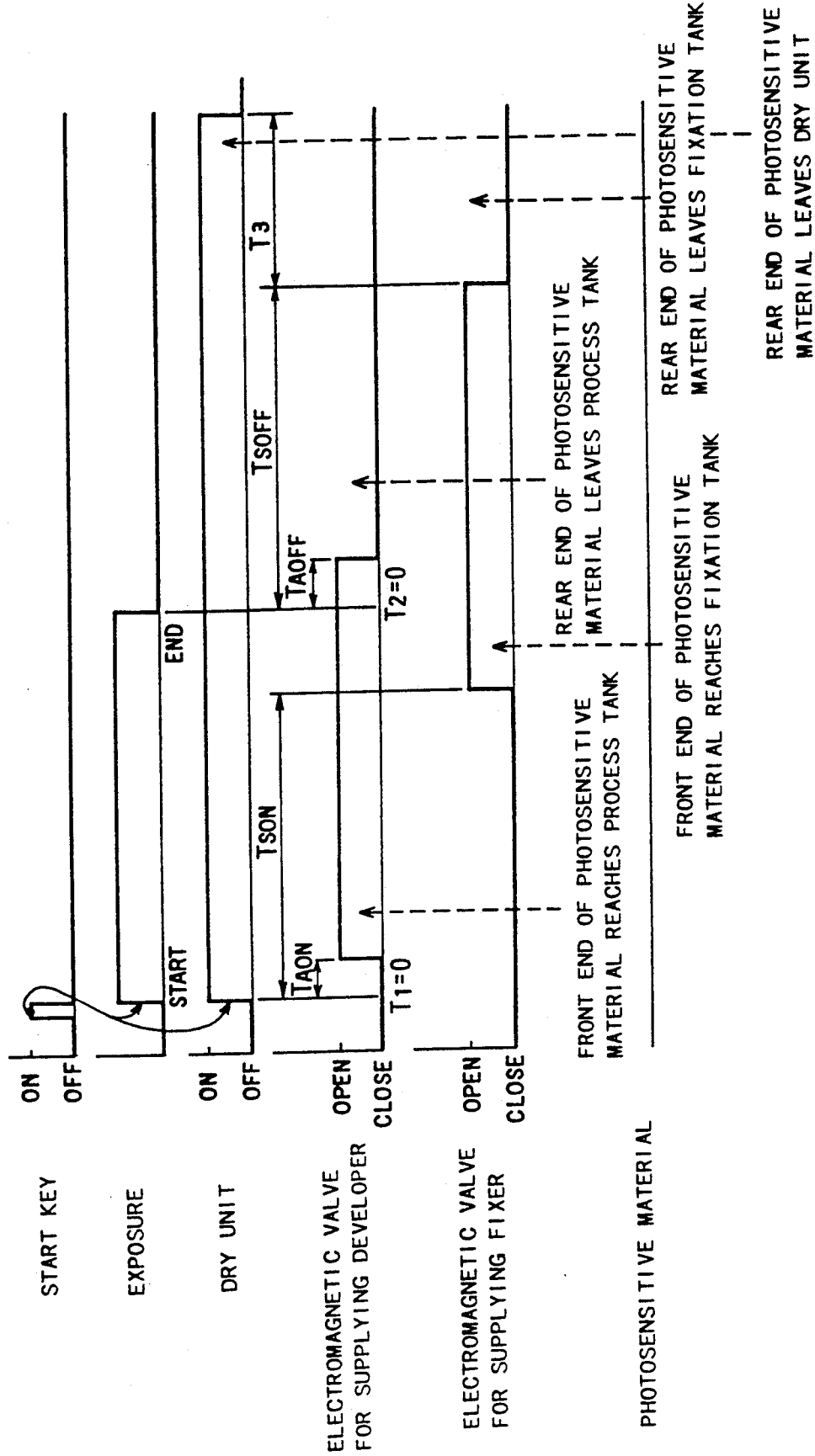

METHOD AND APPARATUS FOR PROCESSING PHOTOSENSITIVE MATERIAL

BACKGROUND OF THE INVENTION

1. Field of the Invention

The present invention relates to method and apparatus for developing, fixing, and processing silver salt photosensitive material including printing paper and photosensitive paper and films for direct plate making.

2. Description of the Prior Art process cameras are applicable to produce a plate directly from an original for in-plant printing, as offset print and mimeographing. A photosensitive material used for such reproduction generally consists of plural layers of different functions adhering to a water proof base sheet. The laminate includes: a layer for preventing halation; a layer of photosensitive silver salt emulsion; and a hydrophilic layer mainly composed of gelatin with nuclei for physical development such as silver dispersed therein. Irradiation with light changes properties of the emulsion layer. In portions irradiated with light, diffusion of reduced silver from the emulsion layer to the surface layer under the influence of developer is efficiently prevented. On the contrary, in other portions without irradiation, silver halide is complexed and diffused from the emulsion layer to the surface layer. The silver halide diffused onto the surface is physically developed to deposit metallic silver. In subsequent fixation, printing ink is mounted only on lipophilic portions with deposited metallic silver and is not on other portions. A plate for in-plant printing is accordingly prepared.

The photosensitive material reacts with processing solution such as developer at a high rate. A momentary hold of the material in the processing solution or rough surface of the solution may cause unevenness of development or other processes. Still processing solution is hence required to maintain high processing quality. A method proposed to fulfill the requirement is that photosensitive material is soaked in a large volume of processing solution such as developer or fixer stored in a tank. In this case, there is need of large apparatus or equipment for storing a large volume of processing solution.

A photosensitive material soaked in a large volume of processing solution is conveyed slowly so as to keep the surface still, and is taken out of the process tank on completion of processing such as development or fixation. Processing solution in which the photosensitive material is drenched, is efficiently removed with a pair of wring rollers disposed opposite to each other in the down stream of the process tank, so that contamination with the processing solution is prevented. The pair of wring rollers also composes part of a transport system for taking the photosensitive material out of the process tank and transferring the material to subsequent steps.

This method, however, has some drawbacks: a large volume of processing solution stored in the process tank deteriorates with a number of photosensitive materials processed, and alkaline developer in the tank is oxidized with the elapse of time. The changeable properties makes the quality of processing unstable. Frequent replacement of processing solution each after completion of processing of a predetermined number of photosensitive materials is essential to maintain the processing or developing quality. The replacement is, however, time consuming and furthermore changes the processing performance drastically.

This conventional method further requires a relatively long warm-up time for raising the temperature of processing solution to an optimal value. A large capacity of temperature control heater is needed to shorten the warm-up time. It is also difficult to maintain the constant temperature of processing solution in the large volume of tank.

On the other hand, a smaller process tank and thereby a smaller volume of processing solution resuscitate the problem of uneven development or processing. Furthermore, slow transport of photosensitive material through the process tank is required to complete the processing; namely, processing in the smaller tank is time consuming. In winter or cold districts, cold photosensitive material lowers the temperature of processing solution drastically and causes unstable or poor quality of processing.

A further problem of the convention method is sludge accumulating on the bottom of the process tank through development and developer wring processes. Sludge is formed by elution of gelatin from the surface layer of the photosensitive material and by shavings generated when a roll of photosensitive material is cut to a predetermined size. Sludge accumulates on and adheres to the bottom of the tank and is not readily flown away on draining of processing solution; hence additional washing of the tank is required to remove the sludge. Sludge accumulated on the bottom prevents smooth conveyance of the photosensitive material and causes a momentary hold of the photosensitive material in processing solution or rough surface of the solution, resulting in uneven development.

Used developer wrung by the wring rollers returns to the process tank and accelerates deterioration of developer in the tank. Furthermore, sludge in the developer adheres to and accumulates on the surface of the wring rollers to cause difference in level, thus preventing sufficient engagement between the rollers.

Used processing solution wrung by the opposite rollers is collected in the vicinity of the inlet of the photosensitive material and flows along the surface of the photosensitive material. The used processing solution returning to the process tank accelerates deterioration of the developer, thus lowering the quality of development. Furthermore, the used developer on the surface of the photosensitive material causes developing unevenness and poor quality of processed material.

SUMMARY OF THE INVENTION

A general objective of the invention is thus to reduce a required volume of processing solution.

A first additional objective of the invention is to provide a maintenance-free apparatus.

A second additional objective of the invention is to improve processing quality.

A third additional objective of the invention is to provide a method for processing photosensitive material in a short time period.

A forth additional objective of the invention is to provide a simplified system for controlling the temperature of processing solution.

A fifth additional objective of the invention is to provide a method for efficiently wringing out processing solution in which photosensitive material taken out of a process tank is drenched.

A sixth additional objective of the invention is to simplify replacement of processing solution and thereby shorten the time required, and also to maintain processing quality of photosensitive material before and after the replacement.

A seventh additional objective of the invention is to prevent abrupt temperature drop of processing solution due to soak of photosensitive material into the solution and maintain high processing quality.

The above objectives and other related objectives are attained by the following structure of the invention.

The apparatus for processing photosensitive material according to the invention continuously supplies new processing solution, as a band flow having a width of the photosensitive material, to the vicinity of the inlet of the photosensitive material in the process tank. Hence the volume of processing solution required is efficiently minimized. The photosensitive material conveyed is processed with newly supplied processing solution, so that the processing quality is efficiently maintained.

The photosensitive material taken out of the process tank is allowed to react with processing solution in which the surface of the material is drenched, so that the required volume of processing solution in the process tank is further reduced. The time required for processing is also shortened by heating the smaller volume of processing solution in the tank and warming the photosensitive material taken out of the tank and reacting with the processing solution. The temperature of processing solution is readily controlled because of the smaller volume in the tank.

New processing solution is supplied to the vicinity of the inlet of the photosensitive material in the tank by rotation of a roller in the same direction as the conveying direction of the photosensitive material. Accordingly, processing solution in the process tank has a still surface to allow even and stable processing.

The photosensitive material drenched in processing solution thereof is taken out of the tank at a predetermined angle of elevation and wrung in the following way, thus preventing undesirable flow of the processing solution along the surface of the photosensitive material and return of the solution into the process tank. The photosensitive material taken out of the tank is wrung between a pair of rollers disposed opposite to each other as wring means, and the processing solution in which the surface of the photosensitive material is drenched is wrung out by rotation of the rollers in the same direction as the conveying direction of the photosensitive material. The upper roller of the pair is shifted downstream against the conveying direction of the photosensitive material. The photosensitive material elevated at the predetermined angle is pressed between such rollers and thus transferred downward corresponding to the shift or angle of the upper roller. That is, the photosensitive material is bent upward immediately before the pair of rollers and pressed between them. Processing solution wrung out of the surface of the photosensitive material is collected in a space defined by the circumference of the upper roller and the photosensitive material bent upward or transferred downward. The structure prevents used processing solution from flowing along the surface of the conveyed material and returning to the process tank.

A scraper disposed to be engaged with at least one roller of the pair can efficiently scrape away the processing solution and sludge on the surface of the roller, thus preventing adhering and accumulation of sludge onto the roller.

Processing solution and sludge collected in the groove formed on the bottom of the process tank are readily drained out of the process tank via the valve. A volume of new processing solution equivalent to the drained solution is successively supplied into the tank as described above.

Processing solution in the process tank is preliminary heated prior to insertion of the photosensitive material so as to prevent an abrupt temperature drop of the solution due to the insertion. Namely, the photosensitive material is processed in the solution of adequate temperatures.

The photosensitive material processed by the apparatus of the invention is silver salt photosensitive paper and films for reproduction as well as silver salt printing paper.

BRIEF DESCRIPTION OF THE DRAWINGS

The invention may be best understood by referring to the following detailed description of the preferred embodiments and the accompanying drawings, wherein like numerals denote like elements and in which:

FIG. 18 is a timing chart showing timings of transport of a photosensitive material PM and each operation in the third embodiment.

DESCRIPTION OF THE PREFERRED EMBODIMENT

Apparatus for processing photosensitive material of the invention is now described based on preferred embodiments thereof.

Figure 1:
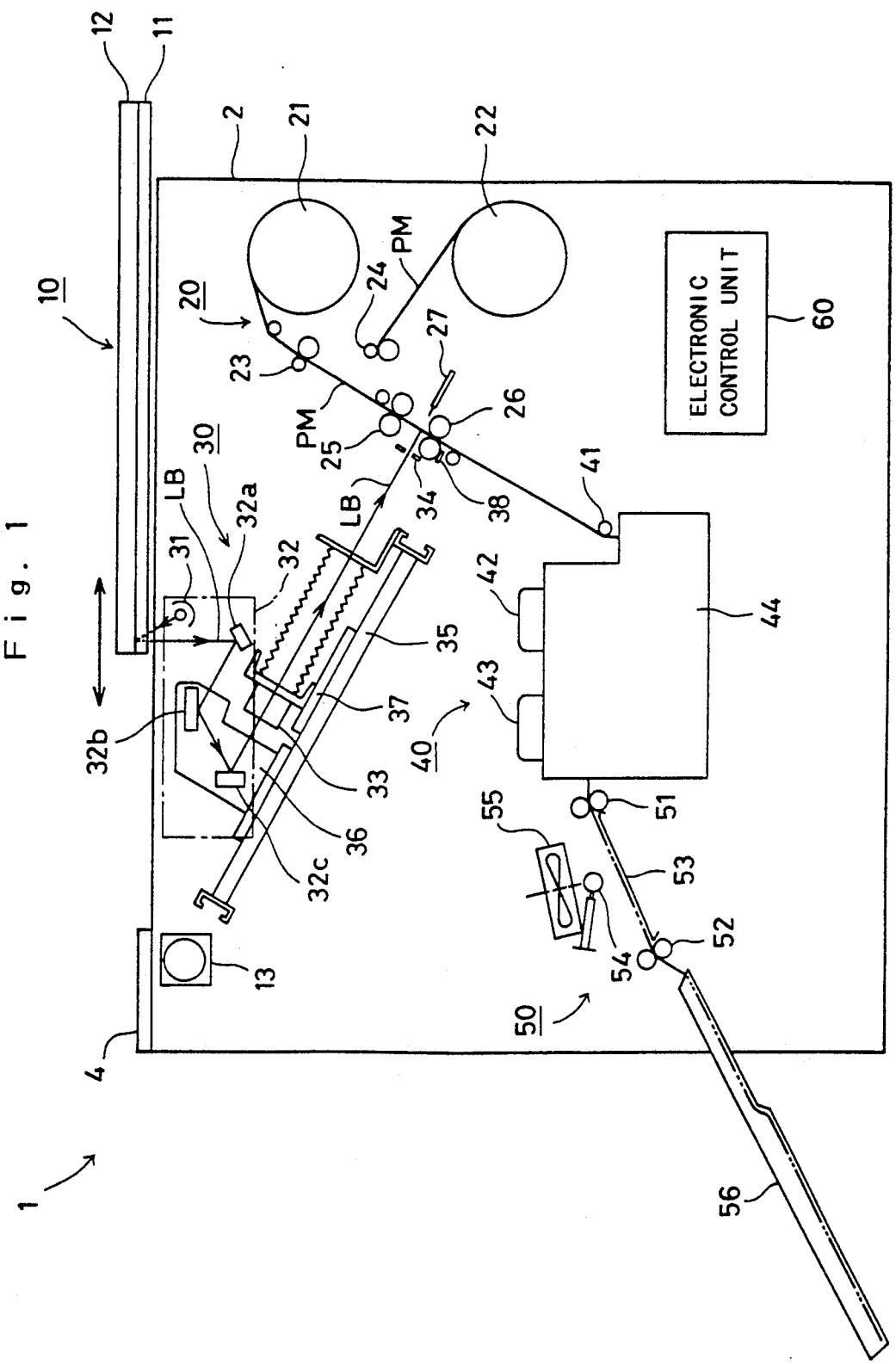
FIG. 1 is a schematic view showing a slit exposure process camera 1 including a processor of a first embodiment.

FIG. 1 is a schematic view showing a slit exposure process camera 1 for reproducing an original to form a plate for in-plant printing.

The slit exposure process camera 1 includes an optical projection system and a processor (described later) disposed in a camera casing 2 as shown in FIG. 1. The camera 1 includes: a console panel mounted on the upper face of the camera casing 2; a holder 10, horizontally movable along the upper face of the camera casing 2, for supporting an original; a photosensitive material transport unit 20 for conveying a sheet of photosensitive material PM to the position of exposure; an optical projection system 30 for irradiating an original held in the holder 10 with light and projecting the light reflected from the original onto the surface of the photosensitive material PM for exposure; a processor 40 for developing and fixing the exposed photosensitive material PM; a dry unit 50 for drying the photosensitive material PM sent from the processor 40; and an electronic control unit 60 for actuating and controlling motors and electromagnets (described later).

On the console panel 4, Various switches including set switches for determining exposure conditions, a power switch, and a start switch are mounted. These switches are operated by an operator. Each switch on the console panel 4 is connected to the electronic control unit 60.

The holder 10 includes a transparent glass base 11 and an openable cover 12. An original is placed with the surface downward in between the base 11 and the cover 12. The holder 10 is driven by a motor 13, disposed in the camera casing 2, via a driving system (not shown in figures) including a sprocket, a chain, and a belt so as to move horizontally to send the original to an exposure light at a uniform speed.

The photosensitive material transport unit 20 includes: a first roll of photosensitive material 21; a second roll of photosensitive material 22; a pair of rollers 23 for feeding the photosensitive material from the first roll 21; a pair of rollers 24 for feeding the photosensitive material from the second roll 22; and two pairs of rollers 25 and 26 used for feeding the photosensitive material both from the first and the second rolls 21 and 22. The photosensitive material transport unit 20 feeds a sheet of the photosensitive material PM from either of the first and the second rolls 21 and 22 as required. In the embodiment, a silver salt photosensitive sheet sold under the trade name SILVER MASTER SLM-RII by Mitsubishi Paper Mills, Ltd. is used; however, it may be any silver salt photosensitive paper for reproduction such as one sold under the trade name of SUPER MASTER SPP by Agfa Gevaert, silver salt films, or high-sensitive PS plates.

The photosensitive material PM is successively fed from the first roll 21 and conveyed through the three pairs of rollers 23, 25, and 26 as seen in FIG. 1. Alternatively, the photosensitive material PM of the second roll 22 is conveyed through the roller pairs 24, 25, and 26.

Conveyance of the photosensitive material PM fed from the first roll 21 or the second roll 22 is synchronized with the horizontal movement of the holder 10. The photosensitive materials of the first roll 21 and the second roll 22 generally have different widths.

The photosensitive material PM thus conveyed is exposed at a position preset between the two pairs of rollers 25 and 26 and cut to a certain size, predetermined with the console panel 4, by a cutting device 27 attached on the rear face side of the photosensitive material PM.

The optical projection system 30 includes: a light source 31 for irradiating the width of the original held in the holder 10; a mirror combination 32 consisting of three mirrors 32a, 32b, and 32c for reflecting light LB reflected from the original; a projecting lens 33 for focusing an image representing the original on the surface of the photosensitive material PM placed at the exposure position; and a slit 34 for adjusting the width of the light LB projected on the surface of the photosensitive material. The projecting lens 33 and the mirrors 32b and 32c of the mirror combination 32 are fixed to a lens support 37 and a mirror support 36 on a slope base 35, respectively. The projecting magnification of the optical projection system 30 is set to one. The positions of the mirror support 36 and the lens support 37 are adjusted with respect to the slope base 35 on the alignment of the system 30 and then fixed thereto.

Light transmitting from the light source 31 to the original is reflected from the lower face of the original. The reflected light LB is successively reflected from the mirrors of the mirror combination 32, passes through the projecting lens 33 and the slit 34, and is focused on the face of the photosensitive material PM. Namely, a band of image corresponding to the width of the original is focused on the photosensitive face of the conveyed photosensitive material PM. Since the transport of the photosensitive material PM is synchronized with the horizontal movement of the holder 10, exposure of the whole original is accomplished with completion of the horizontal movement of the holder 10. The photosensitive material PM is then cut by the cutting device 27.

At the downstream position of the roller pair 26, plural LEDs 38 are aligned downstream for exposing the photosensitive material PM. A desired portion of the photosensitive material PM is irradiated with part of or the whole LEDs 38. Periphery of the photosensitive material, which is not exposed to the light LB reflected from the original, may be burned out as non-required portion on reduced exposure.

The processor 40 is disposed below the optical projection system 30 for developing and fixing the photosensitive material transferred via a guide roller 41. The processor 40 includes a process unit 44 integrally driven with the rollers by a motor (not shown in figures) and stored in the casing 2. A main developer tank 42 for storing developer and a main fixer tank 43 for storing fixer are detachably attached to the process unit 44. Details of the processor 40 are described later.

The dry unit 50 is disposed downstream the processor 40 along the transport path of the photosensitive material PM. The dry unit 50 includes: two pairs of rollers 51 and 52 for conveying the photosensitive material PM processed by the processor 40; a transport tray 53 mounted in between the roller pairs 51 and 52; a heater 54 and a fan 55 disposed above the transport tray 53 for drying the photosensitive material PM; and an external tray 56 disposed outside the casing 2 for storing the photosensitive material PM thus dried.

The photosensitive material PM exposed is processed for development and fixation by the processor 40, dried with the heater 54, and then fed out to the external tray 56 outside the casing 2. A plate for offset printing is accordingly reproduced and formed from the original.

The processor 40 for developing and fixing the photosensitive material PM is described based on FIGS. 2, 3, 4, and 5.

Figure 2:
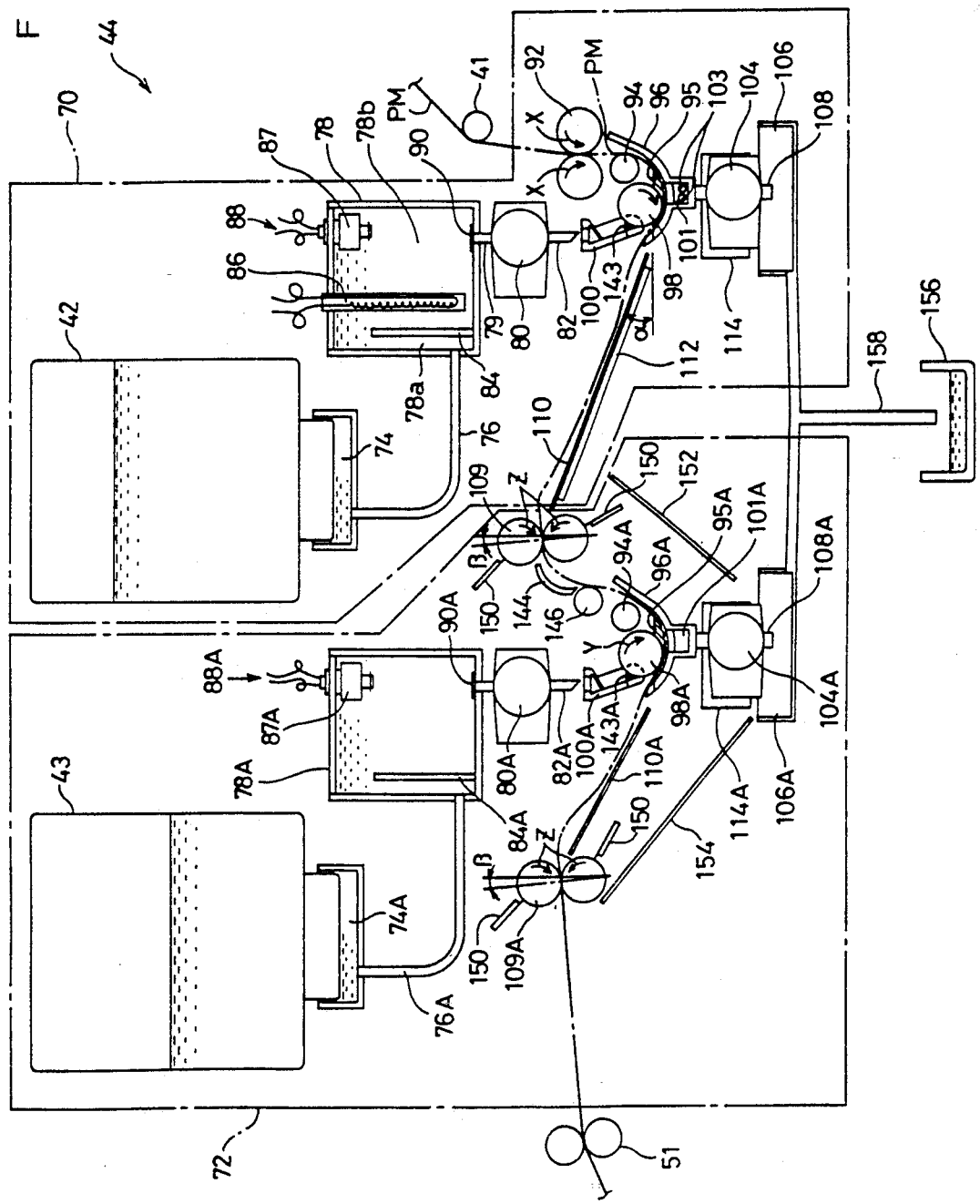
FIG. 2 is a schematic view showing structure of the processor of FIG. 1 embodying the invention.

As seen in FIG. 2, the processor 40 includes: a development unit 70 for developing the photosensitive material PM, exposed and conveyed through the guide roller 41, with developer in the main developer tank 42; and fixation unit 72 for fixing the developed photosensitive material PM with fixer in the main fixer tank 43 and transferring the fixed material PM to the roller pair 51 of the dry unit 50.

Besides the main developer tank 42, the development unit 70 includes: liquid level control cylinder 74 detachably mounted on the main developer tank 42 for receiving developer supplied from the main tank 42 and maintaining the liquid level constant; a developer cistern tank 78 for receiving the developer via the liquid level control cylinder 74 and a conduit 76; an electromagnetic valve 80 for opening and closing an exit path of the developer running from the developer cistern tank 78; and a developer nozzle 82 for making flow of the developer. The developer nozzle 82 has a orifice (see FIG. 5), which controls the amount of developer supplied from the developer nozzle 82 while the electromagnetic valve 80 opens. The amount of supply is determined corresponding to the inner diameter of the orifice and the pressure applied to the orifice with respect to the liquid level in the liquid level control cylinder 74. In the embodiment, the liquid level is maintained constant and flow of the developer is thus kept constant irrespective of the volume of developer in the main developer tank 42.

The developer cistern tank 78 includes an upright panel 84 for separating a reserve chamber 78b from a flow chamber 78a having the conduit 76. A heater 86 inserted downward and a float sensor 88 are mounted on the upper face of the reserve chamber 78b. The float sensor 88 has a float 87 which is vertically movable corresponding to the liquid level, and thereby detects the liquid level of the tank 78. An opening of a passage 79 connected to the bottom of the developer cistern tank 78 has a mesh filter for removing dust or foreign matters from developer which flows out.

Cold developer supplied from the main developer tank 42 first flows into the flow chamber 78a via the conduit 76 and then passes over the upright panel 84 to the reserve chamber 78b. Developer in the reserve chamber 78b is heated with the heater 86 and kept at a predetermined temperature by the electronic control unit 60. The developer thus heated flows out of the developer nozzle 82 by opening of the electromagnetic valve 80.

Structure and function of a process tank 96 for developing the photosensitive material PM are described hereinafter. A pair of feed rollers 92 rotating in a direction shown by the arrow X of FIG. 5 to feed the photosensitive material PM is disposed below the guide roller 41 for feeding the photosensitive material PM to the development unit 70. A free roller 94 is further disposed below the roller pair 92 for guiding the photosensitive material PM to give tension to the material PM.

Figure 3:
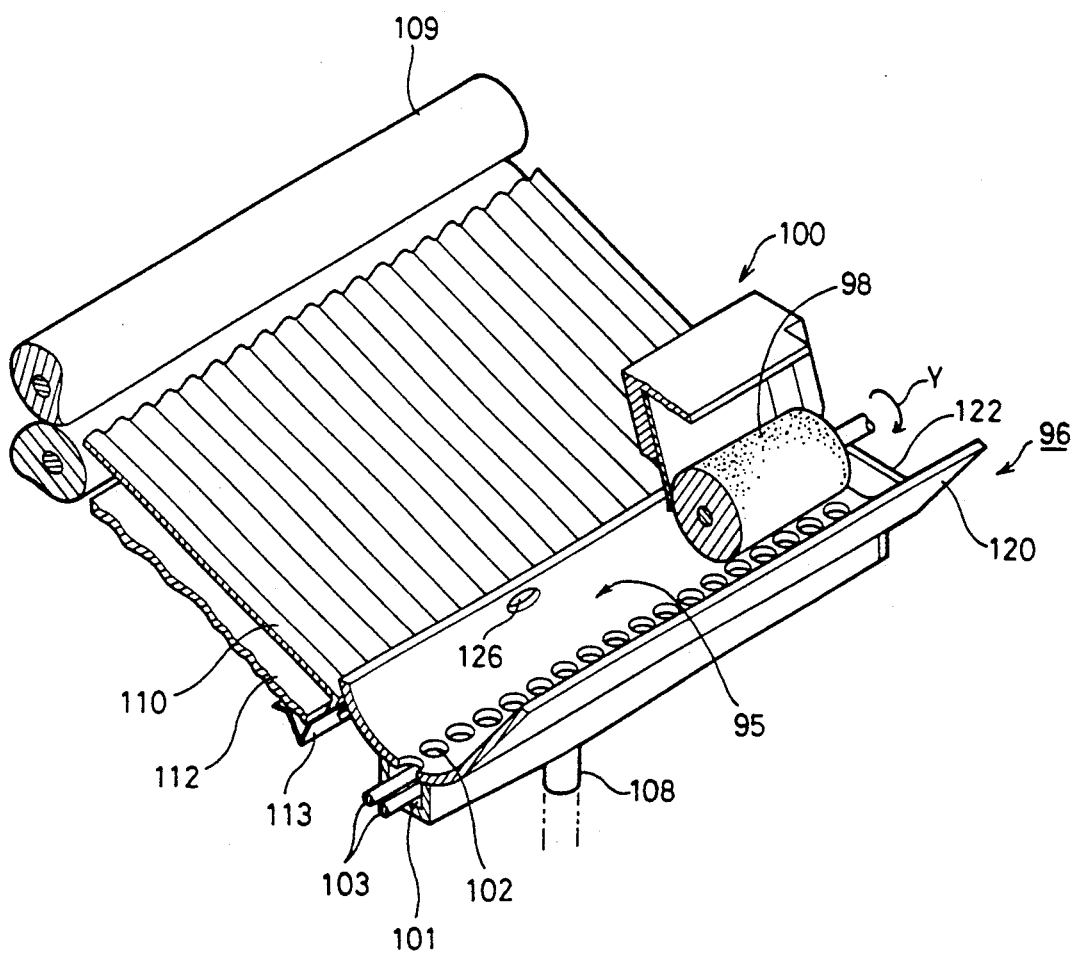
FIG. 3 is a perspective view illustrating a process tank 96.

A guide plate 110 having a predetermined angle of elevation α against the fixation unit 72 is disposed on the opposite side of the process tank 96. As shown in FIG. 3, the guide plate 110 is corrugated so as to decrease the contact resistance to the photosensitive material PM, and feeds the developed photosensitive material PM to a pair of wring rollers 109 of the fixation unit 72. A panel heater 112 having a function of self-temperature-stabilizing is attached to the lower face of the guide plate 110. The panel heater 112 is securely fixed to the guide plate 110 with a fixture 113 attached to the process tank 96 and other fixtures as shown in FIG. 3. When electricity is sent, the heater 112 generates heat to maintain the temperature of atmosphere above the guide plate 110 in the vicinity of a predetermined value.

Details of the process tank 96 are described now. The U-shaped process tank 96 is a little wider than the photosensitive material PM. The process tank 96, as shown in FIG. 3, includes a curved plate and arc-shaped side plates 122 (side plate on the left is omitted in FIG. 3) joined with and fixed to both the ends of the curved plate 120. A through hole 126 is formed near the center of the curved plate 120 on the side of the guide plate 110. Supplying developer from the developer nozzle 82, the liquid level increases and developer flows out of the through hole 126. Namely, the level of developer is maintained at the height of the through hole 126. Developer flowing out of the through hole 126 and along the guide plate 110 drops on a cover 114 mounted on an electromagnetic valve 104 disposed immediately below the process thank 96 and is collected in a waste tray 106.

The process tank 96 is provided with a developer supply roller 98 mounted along the width of the tank 96. The developer supply roller 98 is disposed at a certain distance from the bottom of the process tank 96 and the lower portion thereof is soaked in developer stored in a reservoir 95.

Figure 4:
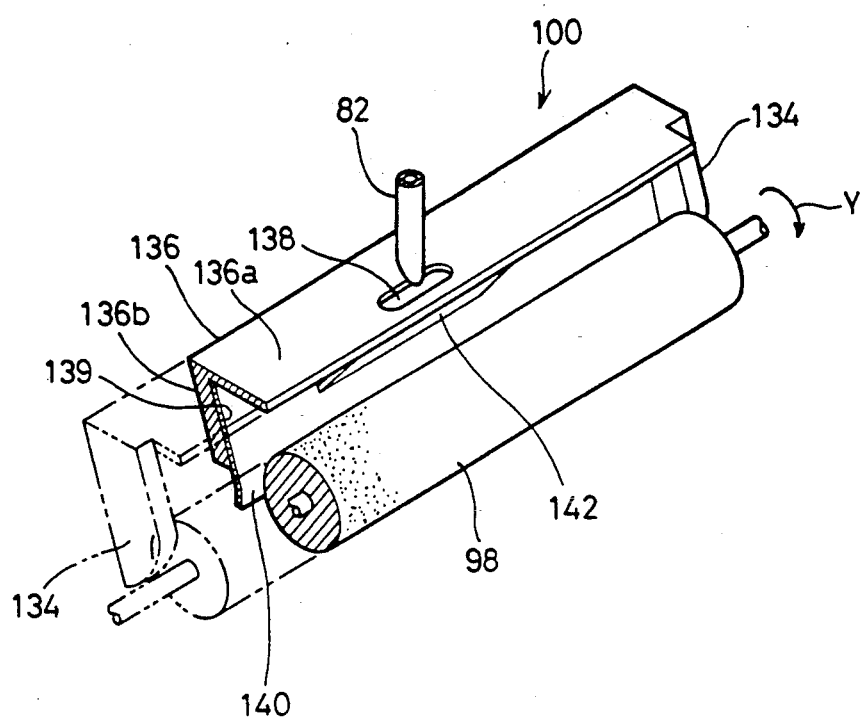
FIG. 4 is a perspective view illustrating a supply roller 98 and a temporary reservoir 100.

The surface of the developer supply roller 98 is made of sponge containing lots of separate pores. As seen in FIG. 4, the developer supply roller 98 is provided with a temporary reservoir 100 for temporarily storing developer dropped downward.

Figure 5:
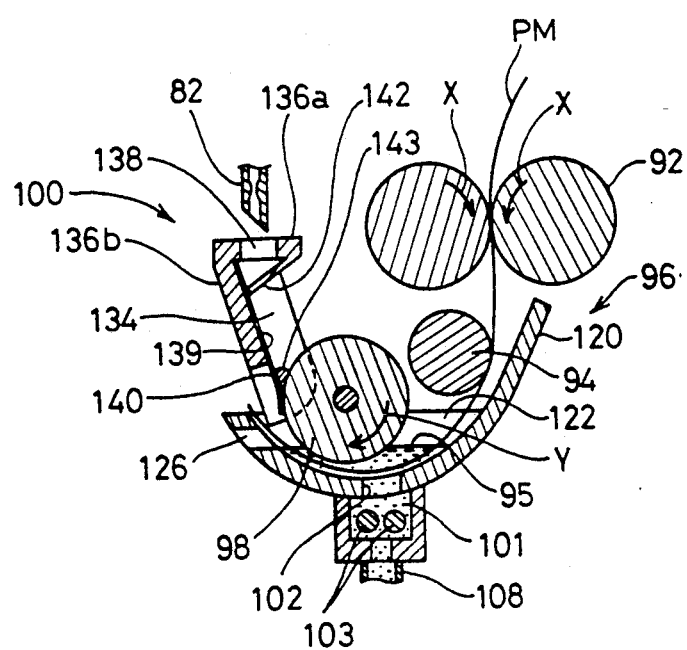
FIG. 5 is a cross sectional view illustrating the arrangement of the supply roller 98 and the temporary reservoir 100 with the process tank 96.

The temporary reservoir 100 shown in FIGS. 4 and 5 includes: two side plates 134 in contact with either side of the developer supply roller 98 to allow rotation of the roller 98; and a support plate 136 of a numeral "7" shape connecting the side plates 134 on the side ends of the plate 136. A hole 138, which developer passes through, is formed at a position corresponding to the end of the developer nozzle 82 on the center of an upper plate 136a of the support plate 136. A stainless steel leaf spring 140, which is mounted on a rear plate 136b of the support plate 136, is pressed against the developer supply roller 98 to be in contact with the circumference of the roller 98.

A developer saucer 142 mounted directly below the hole 138 extends from the front center of the upper plate 136a towards the leaf spring 140. There is a small space between the end of the developer saucer 142 and the leaf spring 140. A basin 143 defined by the developer supply roller 98 rotating clockwise, the side plates 134, and the leaf spring 140 pressed against the circumference of the roller 98 can temporarily store developer dripped down from the developer nozzle 82.

The developer saucer 142 efficiently spreads developer along the axis of the developer supply roller 98. Developer is, however, spread along the axis of the developer supply roller 98 even without the developer saucer 142 since the developer is temporarily stored in the basin 143.

Developer dripped down from the developer nozzle 82 passes through the hole 138 to the developer saucer 142, runs from the sides of the developer saucer 142 and through the space between the saucer 142 and the leaf spring 140, and flows down along the surface of the leaf spring 140 as seen in FIGS. 4 and 5. Accordingly, the developer is spread along the axis of the developer supply roller 98 and is temporarily stored in the basin 143. Part of the developer stored in the basin 143 is held in the separate pores on the surface of the developer supply roller 98 and drawn out with rotation of the roller 98 in a direction shown by the arrow Y of FIG. 5. Since pores are evenly formed along the axis on the surface of the developer supply roller 98, developer is uniformly held on the roller 98.

Since the lower portion of the developer supply roller 98 is soaked in developer stored in the process tank 96, new developer drawn out with rotation of the developer supply roller 98 is added to the developer stored in the reservoir 95. Newly supplied developer is uniformly diffused in the vicinity of the inlet of the photosensitive material PM in the process tank 96. While the newly supplied developer increases the level of developer in the reservoir 95, a certain amount of used developer is discharged from the through hole 126 of the curved plate 120. The amount of developer discharged is determined by subtracting a portion lost with conveyance of the photosensitive material PM from the amount of newly supplied developer. Hence the level of developer is maintained constant in the reservoir 95.

A bottom reserve chamber 101 is formed by a narrow groove that extends across the width of the process tank 96 as seen in FIGS. 3 and 5. Developer flows in and out through plural apertures 102 formed on the bottom of the process tank 96. The bottom reserve chamber 101 is provided with two bar heaters 103 for heating the developer. A developer discharge pipe 108 formed below the center of the bottom reserve chamber 101 is connected to the bottom reserve chamber 101 via the electromagnetic valve 104 for opening and closing the discharge pipe 108, and drains used developer into the waste tray 106.

Developer the flows into the bottom reserve chamber 101 is heated with the bar heaters 103 and circulated through the apertures 102 to the reservoir 95. Application of electricity to the bar heaters is controlled based on feed-back data on the temperature of developer detected by a temperature detector, and hence developer in the process tank 96 is heated in a very short time period and maintained at a predetermined temperature.

When the photosensitive material PM is conveyed through developer in the reservoir 95 of the process tank 96, sludge is formed in the developer. The sludge is discharged from the reservoir 95 to the bottom reserve chamber 101, and drained together with the used developer through the discharge pipe 108 into the waste tray 106 while the electromagnetic valve 104 opens.

Conveyance of the photosensitive material PM is described in detail. The exposed photosensitive material PM fed by the pair of feed rollers 92 is conveyed along the free roller 94 into the reservoir 95 and passes through the developer along the inner surface of the curved plate 120 of the process tank 96. The photosensitive material PM reacts with developer stored in the reservoir 95 of the process tank 96 and is developed. Newly supplied developer drawn out of the pores of the developer supply roller 98 mainly contributes to the development of the photosensitive material PM. The photosensitive material PM passing between the developer supply roller 98 and the curved plate 120 in the reservoir 95 is then conveyed along the upper face of the guide plate 110 to the pair of wring rollers 109 mounted on the inlet of the fixation unit 72. The temperature of atmosphere above the guide plate 110 is controlled in the vicinity of a predetermined value by heating with the panel heater 112 with the temperature control function. Development of the photosensitive material PM is proceeded with developer in which the surface of the material PM is drenched while the photosensitive material PM is conveyed along the guide plate 110. Developer in which the surface of the photosensitive material PM is drenched, is wrung out and removed by the pair of wring rollers 109. Development of the photosensitive material PM is accordingly completed.

The fixation unit 72 for fixing the photosensitive material PM is now described in detail based on FIG. 2. The fixation unit 72 includes similar members or members of similar functions as the development unit 70, which are not described here and shown by the same numerals as the development unit 70 plus the letter A.

The fixation unit 72 includes: a main fixer tank 43; a liquid level control cylinder 74A detachably mounted on the main fixer tank 43; an fixer cistern tank 78A with an upright panel 84A therein; a conduit 76A for connecting the liquid level control cylinder 74A to the fixer cistern tank 78A; and a fixer nozzle 82A equipped with an electromagnetic valve 80A. The fixer cistern tank 78A further includes a float sensor 88A with a float 87A and a mesh filter 90A as in the developer cistern tank 78. When used fixer is discharged from the fixer cistern tank 78A via the electromagnetic valve 80A and the fixer nozzle 82A, new fixer of the same volume is supplied through the conduit 76A from the main fixer tank 43.

Other constituents of the fixation unit 72 are briefly described according to conveying process of the photosensitive material PM. The photosensitive material PM passing through the pair of wring rollers 109 disposed on the upper end of the guide plate 110 of the development unit 70 travels along a guide cover 144 and a free roller 146 and is fed into a fixation tank 96A. Another free roller 94A for giving tension to the photosensitive material PM is mounted on the inlet of the fixation tank 96A. The fixation tank 96A includes: a reservoir 95A; a fixer supply roller 98A made of sponge; a temporary reservoir 100A for supplying fixer to the reservoir 95A; a basin 143A consisting of the fixer supply roller 98A and the temporary reservoir 100A; and a bottom reserve chamber 101A. When an electromagnetic valve 104A with a cover 114A is opened, used fixer is discharged from the bottom reserve chamber 101A to a waste tray 106A via a fixer discharge pipe 108A. No heater is disposed in the bottom reserve chamber 101A since fixer does not require heating and temperature control.

A guide plate 110A ascending from the fixation tank 96A is disposed downstream of the fixation tank 96A for feeding the fixed photosensitive material PM. A pair of wring rollers 109A are disposed on the upper end of the guide plate 110A and rotate in a direction shown by the arrow Z of FIG. 1. Accordingly, the fixed photosensitive material PM is conveyed to the rollers 51 of the dry unit 50 (see FIG. 2) and wrung to discharge excess of fixer in which the surface of the photosensitive material PM is drenched. The fixer supply roller 98A and the wring rollers 109 and 109A are driven by the same driving source as the rollers of the process tank 96 and synchronously rotated.

Each upper roller of the wring rollers 109 and 109A is a little shifted to the downstream as shown in FIG. 2. It means that a plane including the center of the roller pair 109 or 109A is shifted counterclockwise from a vertical plane including the center of the lower roller by an angle $\beta$. Namely, the photosensitive material PM is conveyed along the wring rollers 109 and 109A downward at an angle corresponding to $\beta$. The photosensitive material PM is conveyed along the guide plate 110 or 110A at the predetermined angle of elevation $\alpha$ and thus curves upward to enter the rollers 109 or 109A as shown in the dash-and-doted line of FIG. 2.

Developer or fixer in which the surface of the photosensitive material PM is drenched, is mostly wrung out by the wring rollers 109 or 109A, and collected on the upstream of the roller pair 109 or 109A. To be concrete, wrung-out developer or fixer remains in a space between the surface of the photosensitive material PM traveling downward and the circumference of the upper roller of the wring roller pair 109 or 109A until the whole length of the photosensitive material PM passes through the rollers 109 or 109A. Accordingly, developer or fixer does not drip along the surface of the photosensitive material PM.

Immediately after the rear end of the photosensitive material PM passes through the wring rollers 109 or 109A, developer or fixer remaining in the space flows along the surface of the lower roller of the roller pair 109 or 109A and drips down along a right collection panel 152 or a left collection panel 154 to the waster tray 106A.

Each roller of the wring roller pair 109 or 109A is engaged with a scraper 150. The scraper 150 is composed of material having corrosion resistance and elasticity, for example, a stainless steel plate with a polished end or with an end covered with plastics to make itself durable as well as to protect the surface of the rollers 109 or 109A. The end of the scraper 150 may be covered with plastics having chemical and abrasion resistance such as fluororesin, polyester, or vinyl chloride resin.

Sludge or waste scraped away by the scraper 150 drops on the right collection panel 152 or the left collection panel 154 to be collected on the waste tray 106A. Each of the waste trays 106 and 106A of the development unit 70 and the fixation unit 72 is connected to a waste tank 156 through a pipe 158. Accordingly, waste or sludge on the trays 106 and 106A is discharged to the waste tank 156.

In the fixation unit 72 thus constructed, the developed photosensitive material PM conveyed from the development unit 70 is wrung by the pair of wring rollers 109 and is conveyed along the free roller 94A into the reservoir 95A for fixation of the photosensitive material PM. Fixation of the photosensitive material PM is proceeded with fixer in which the surface of the photosensitive material PM is drenched while the photosensitive material PM is conveyed along the guide plate 110A. Excess of fixer on the surface of the photosensitive material PM is wrung out and removed by the pair of wring rollers 109A, and the photosensitive material PM is then transported to the dry unit 50 via the roller pair 51.

Figure 6:
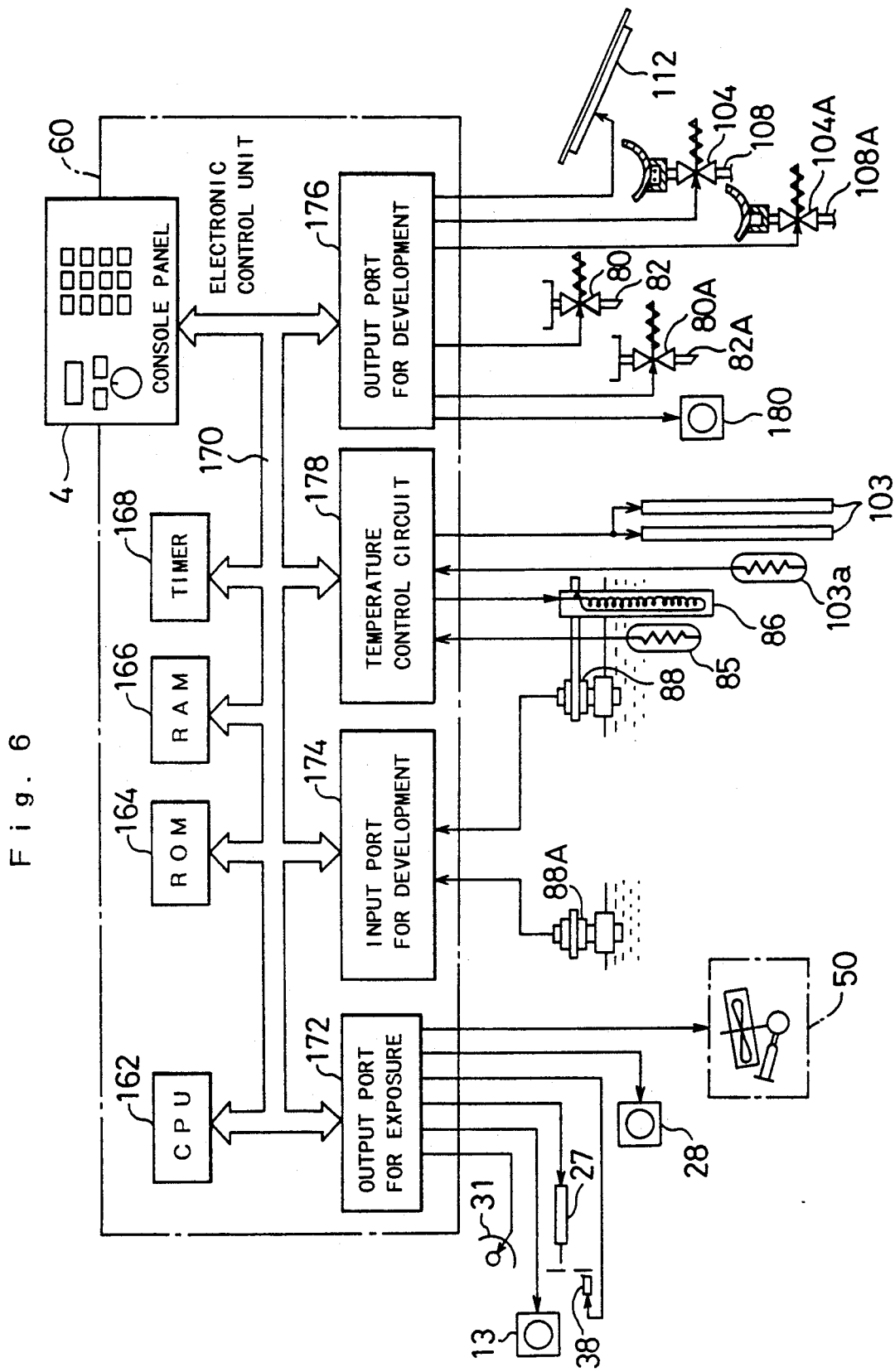
FIG. 6 is a block diagram showing structure of an electronic control unit 60.

The electronic control unit 60 is described in detail according to a block diagram of FIG. 6. The electronic control unit 60 controls the temperature of, for example, the developer cistern tank 78 and actuates and controls rollers including the developer supply roller 98.

As shown in FIG. 6, the electronic control unit 60 is an arithmetic logic operation circuit including: a CPU (central processing unit) 162; a ROM (read only memory) 164; a RAM (random access memory) 166; and a timer 168 with plural independent timer counters. The electronic control unit 60 further includes an output port for exposure 172, an input port for development 174, an output port 176 for development, and other input/output interfaces. The above elements and ports are connected to one another via a common bus 170. The common bus 170 of the electronic control unit 60 is further connected to a temperature control circuit 178 for controlling the temperature of developer in the reservoir 95 and in the developer cistern tank 78 and the console panel 4 used for manual setting.

The output port for exposure 172 is connected to: the motor 13 for driving the holder 10; the cutting device 27 for cutting the photosensitive material PM; the light source 31 for irradiating an original in the holder with light; the motor 28 for feeding the photosensitive material PM from the first roll 21 or the second roll 22; the LED 38 for exposing the photosensitive material PM uniformly; and the dry unit 50 for drying the fixed photosensitive material PM.

The input port for development 174 is connected to: the float sensor 88 in the developer cistern tank 78; and the float sensor 88A in the fixer cistern tank 78A. The output port for development 176 is connected to: a drive motor 180 for driving the rollers of the process unit 44 synchronously; the electromagnetic valves 80, 80A, 104, and 104A respectively mounted on the developer nozzle 82, the fixer nozzle 82A, the developer discharge pipe 108, and the fixer discharge pipe 108A; and the panel heater 112 for heating atmosphere above the guide plate 110 to a predetermined temperature.

The temperature control circuit 178 is connected to: the heater 86 disposed in the developer cistern tank 78; a temperature sensor 85 for detecting the temperature of developer in the tank 78; the two heater bars 103 disposed in the bottom reserve chamber 101; and a temperature sensor 103a for detecting the temperature of developer in the chamber 101. The temperature control circuit 178 controls the heaters so as to maintain temperature of developer in the reservoir 95 and the developer cistern tank 78. The temperature control circuit 178 outputs a signal, which shows whether the temperature is maintained in a predetermined range, to the CPU 162.

Figure 7:
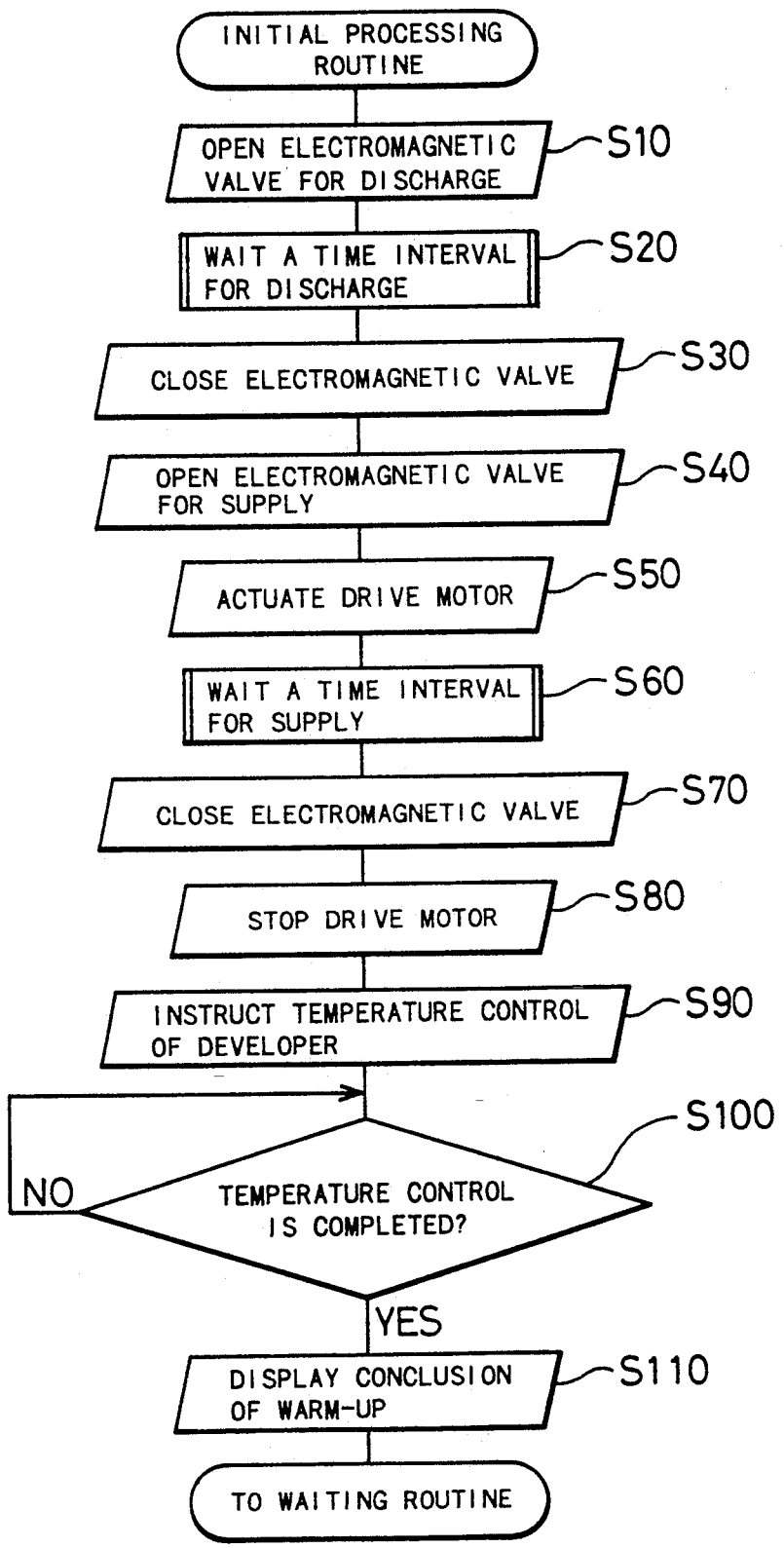
FIG. 7 is a flowchart showing an initial processing routine executed by the electronic control unit 60 of FIG. 6.
Figure 8:
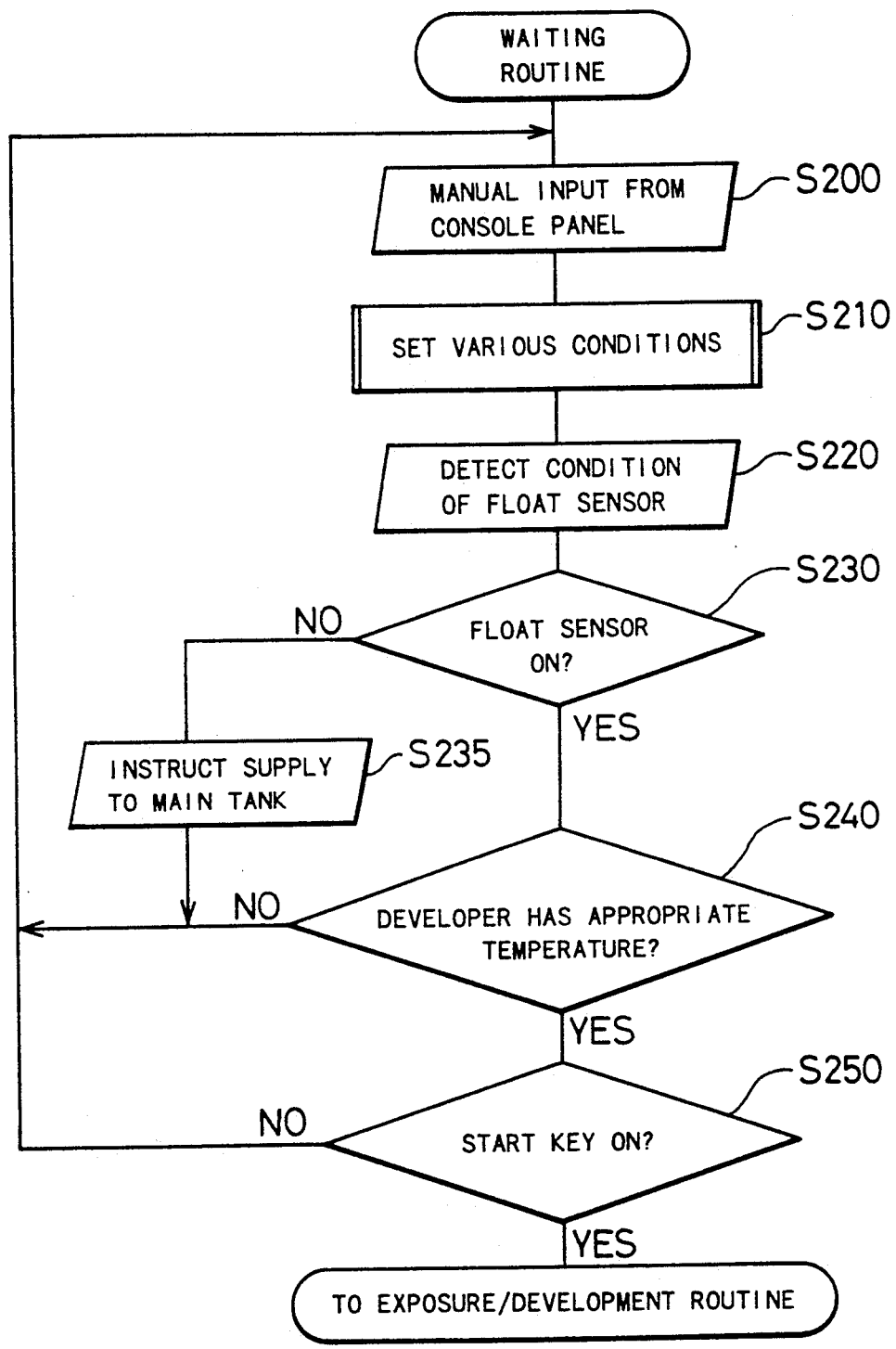
FIG. 8 is a flowchart showing a waiting routine.
Figure 9:
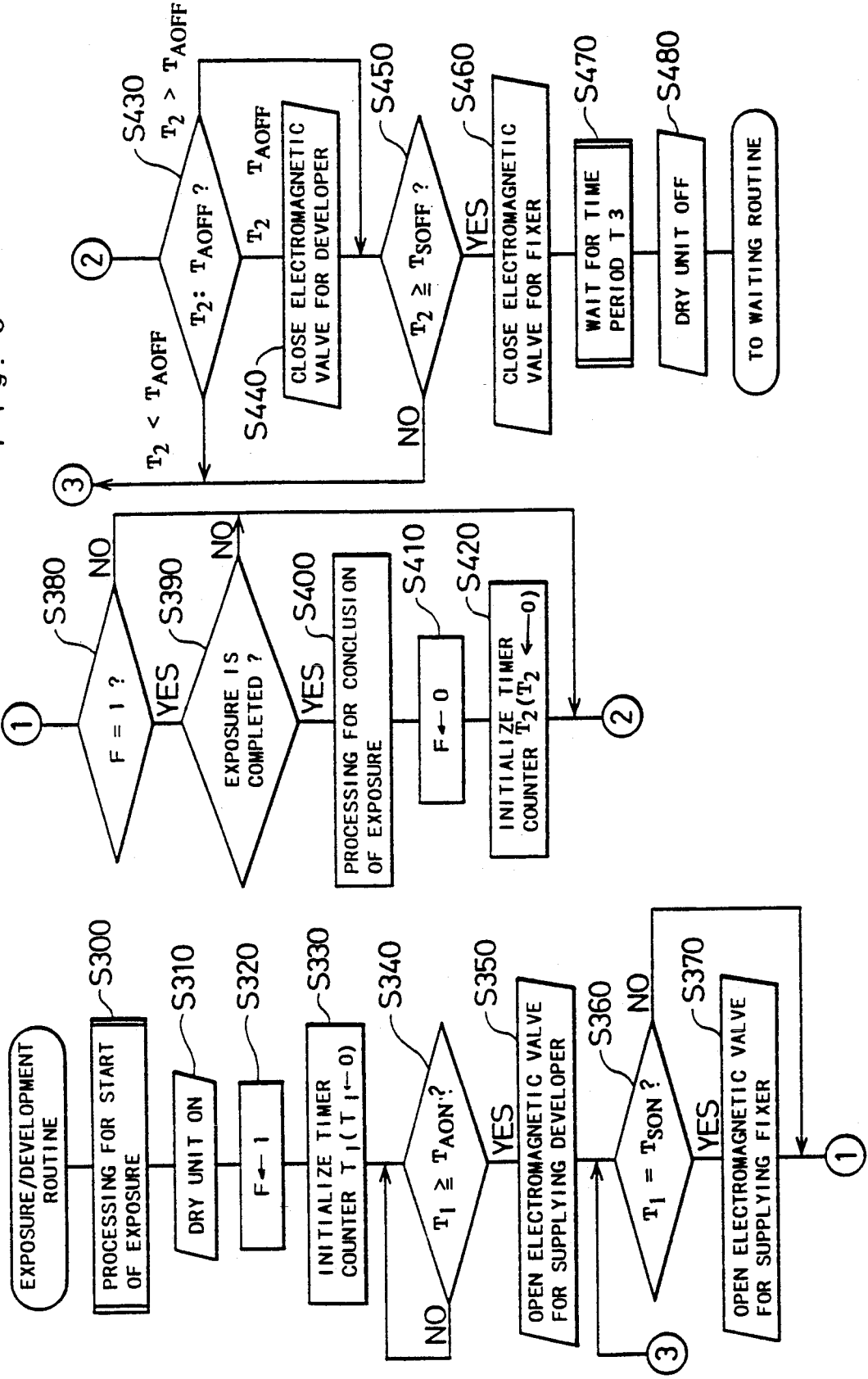
FIG. 9 is a flowchart showing an exposure and development routine.

Processing executed by the electronic control unit 60 in the slit exposure process camera 1 is described based on flowcharts of FIGS. 7 through 9. The flowchart of FIG. 7 shows an initial processing routine executed when the power is supplied; FIG. 8 shows a waiting routine for exposure and development; and FIG. 9 shows an exposure/development routine for exposing and developing the photosensitive material PM.

When the power is supplied to the slit exposure process camera 1, the electronic control unit 60 executes the initial processing routine of FIG. 7. This processing is executed only once at the start of operation of the process camera 1.

When the routine starts, the electromagnetic valves 104 and 104A are opened at step S10 for discharging developer and fixer. At step S20, the electronic control unit 60 waits a certain time period sufficient to discharge developer and fixer (hereinafter referred to as the processing solution as appropriate) from the process tank 96 and the fixation tank 96A (hereinafter referred to as the tank 96 as appropriate). Since the volume of the processing solution in the tank 96 predetermined, the waiting time is easily calculated and preset.

After closing the electromagnetic valves 104 and 104A at step S30, the program proceeds to step S40 at which the electromagnetic valves 80 and 80A are opened, and then to step S50 at which the drive motor 180 is actuated by the signal from the output port for development 176. When the electromagnetic valves 80 and 80A are opened, the processing solution flows from the developer cistern tank 78 and the fixer cistern tank 78A via the developer nozzle 82 and the fixer nozzle 82A. At the same time, the drive motor 180 actuates and rotates the developer supply roller 98 and the fixer supply roller 98A. Accordingly, the processing solution is held in pores on the surface of the rollers 98 and 98A and supplied to each tank 96.

The electronic control unit 60 waits a predetermined time period for supply of the processing solution into the tank 96 at step S60. The program proceeds to step S70 at which the electromagnetic valves 80 and 80A are closed, and then to step S80 at which power to the drive motor 180 is cut to stop rotation of the rollers 98 and 98A. As a result, the tank 96 is filled with the processing solution required for development or fixation.

The program then goes to step S90 at which a signal of start command is output to the temperature control circuit 178 and at the same time, electricity is supplied to the panel heater 112 via the output port for development 176. The temperature control circuit 178 receives the signal and supplies power to the heaters 86 and 103 by referring to the detected signals of the temperature sensors 85 and 103a. The temperature of developer in the developer cistern tank 78 and the process tank 96 are thus maintained within a range between 28 and 31 degrees centigrade. When the temperature control circuit 178 adjusts the temperature of developer within the range, it outputs a signal representing completion of the control to the CPU 162.

The panel heater 112 has low internal resistance immediately after supply of electricity and raises the temperature thereof at a high speed. The internal resistance, however, increases and thereby the power decreases when the temperature rises close to a proper reference value. Accordingly, the temperature of the heater 112 is kept in the vicinity of the reference value. The temperature of the panel heater 112 reaches to the reference value while the temperature control circuit 178 completes the temperature control of developer. The electronic control unit 60 waits until the signal representing completion of the control is output from the temperature control circuit 178 at step S100. When the signal is input, the electronic control unit 60 displays conclusion of warm-up on the console panel 4 at step S110, and exits from the initial routine to proceed to the waiting routine.

Figure 10:
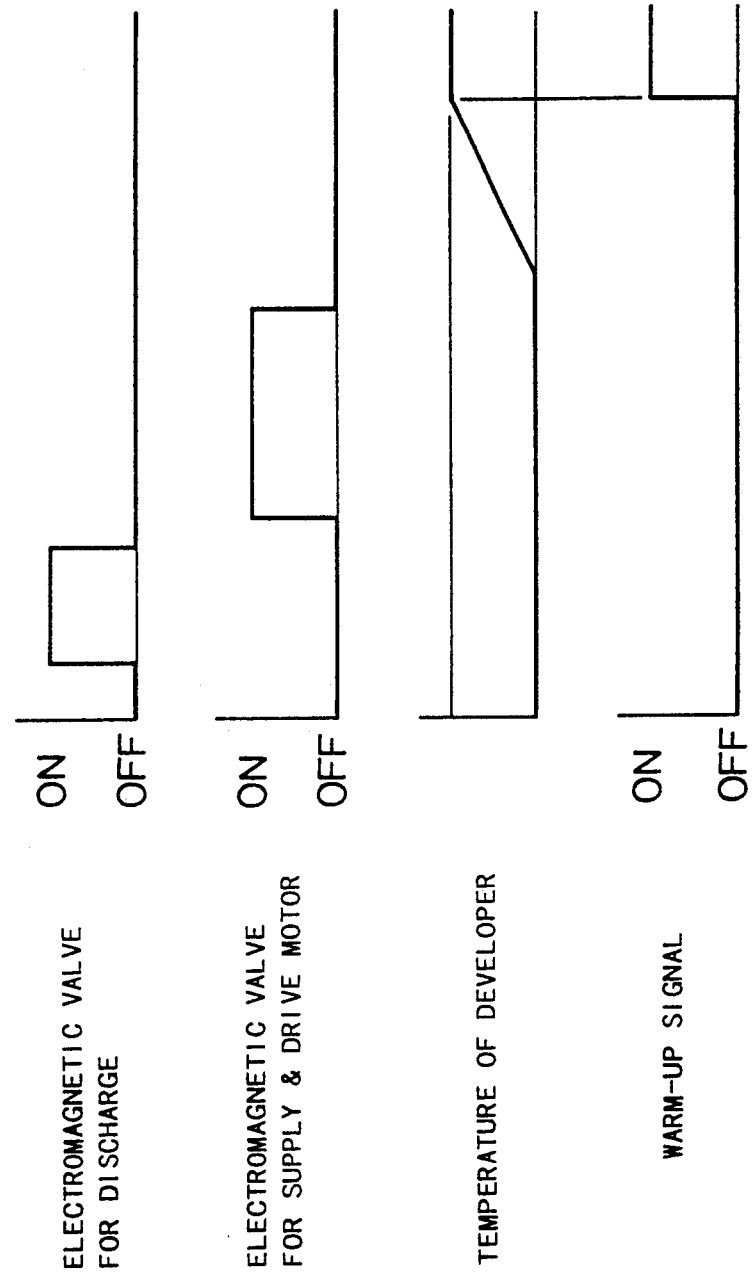
FIG. 10 is a timing chart showing open/close timings of each electromagnetic valve in the initial processing.

FIG. 10 is a timing chart showing timing for opening and closing the electromagnetic valves and outputting the warm-up signal. By execution of this initial processing routine, the processor 40 of the slit exposure process camera 1 discharges the processing solutions (developer and fixer) remaining in the process tank 96 and the fixation tank 96A as well as sludge, supplies new processing solutions to the tanks 96 and 96A, and controls the temperature of development to an adequate value.

The waiting routine of FIG. 8 is executed after conclusion of the initial processing routine. At step S200, various conditions are manually input with keys on the console panel 4. The program then proceeds to step S210 at which various conditions including the size of an original and the intensity of exposure are set corresponding to the input. The electronic control unit 60 detects conditions of the float sensors 88 and 88A of the developer cistern tank 78 and the fixer cistern tank 78A at step S220, and judges whether the float sensor 88 or 88A is ON at step s230. When either of the float sensors 88 and 88A is OFF, that is, when the liquid level of the main developer tank 42 or the main fixer tank 43 is lowered, the electronic control unit 60 displays a signal for instructing further supply of developer of fixer to the main tank 42 or 43 on the console panel 4 at step S235. The program then returns to step S200 and repeats steps S200 through S230.

On the other hand, when both the float sensors 88 and 88A are judged to be ON at step S230, the program proceeds to step S240 at which it is judged whether the temperature of developer is appropriate. When the answer is YES, the program proceeds to step S250 at which it is judged whether a start key on the console panel 4 is turned on for instructing start of exposure. The temperature of developer is controlled by the temperature control circuit 178 and is supposed to be adjusted to an adequate range in the initial processing routine of FIG. 7. The temperature is, however, rechecked against malfunction of the heaters 86 and 103. The program does repeats steps S200 through S250 until developer is maintained at the appropriate temperature and the start key is turned on.

When the above requirements are fulfilled, the program proceeds to the exposure/development routine of FIG. 9. Processing required for start of exposure is executed at step S300, which includes: transport of the original of the original held in the holder 10; conveyance of the photosensitive material PM synchronized with the transport; and actuation of the rollers in the process unit 44 by the drive motor 180. At step S310, the dry unit 50 is turned on to blow hot blast. After a flag F representing exposure is set to 'one' at step S320, a first timer counter T1 of the timer 168 is initialized to zero so as to start counting the time from start of exposure at step S330.

Figure 11:
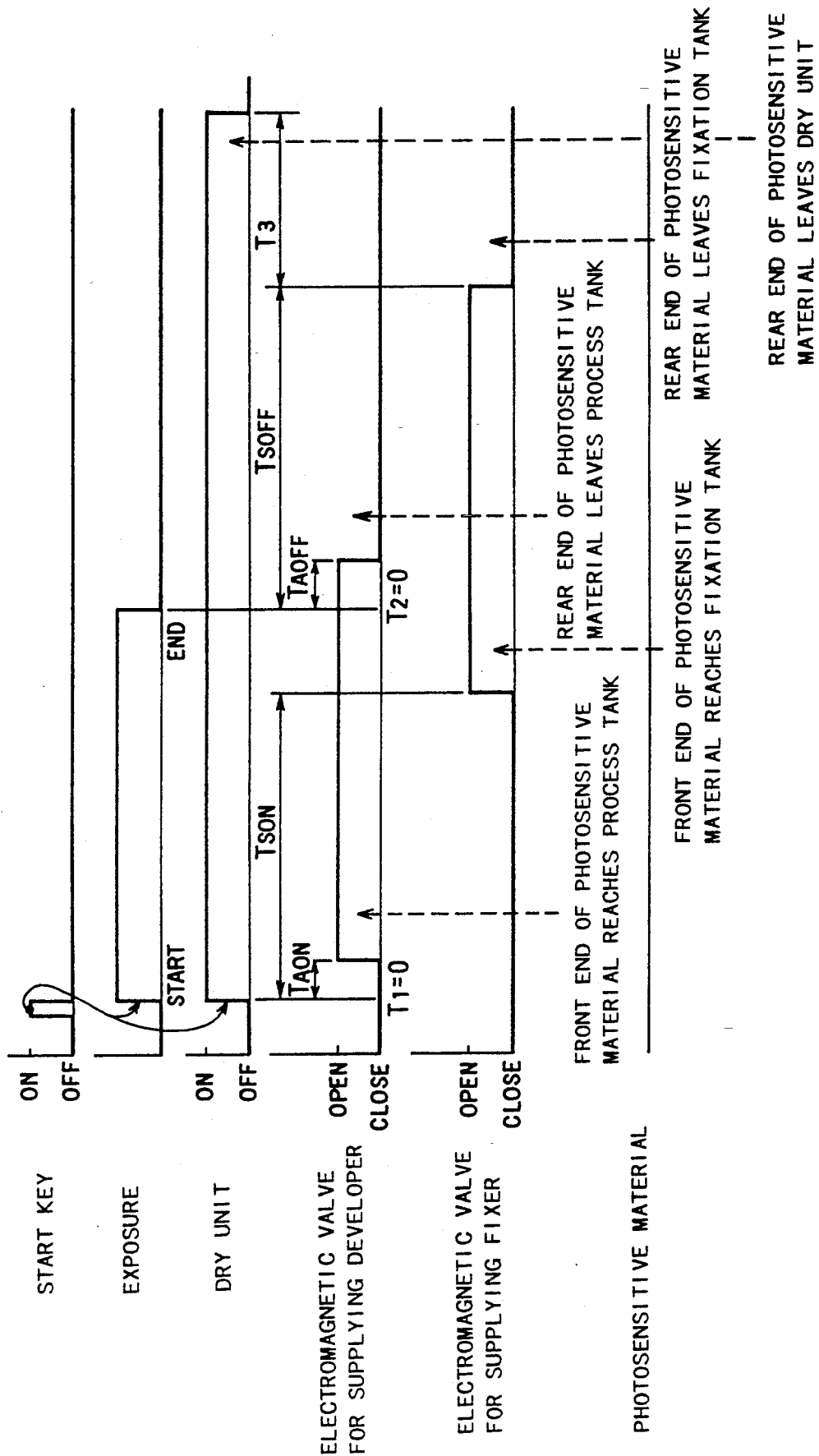
FIG. 11 is a timing chart showing timings of transport of a photosensitive material PM and each operation.

At step S340, the value on the timer counter T1 is compared with a developer supply timing TAON which is the open timing of the electromagnetic valve 80, and the electronic control unit 60 waits until the value of T1 is equal to TAON. When the condition is satisfied, the program proceeds to step S350 at which the electromagnetic valve 80 is opened to supply new developer onto the developer supply roller 98 in the process tank 96. As clearly seen in a timing chart of FIG. 11, supply of new developer is executed after start of exposure and before conveyance of the photosensitive material PM into the process tank 96.

At step S360, the value on the timer counter T1 is compared with a fixer supply timing TSON, which the open timing of the electromagnetic valve 80A. When the value on T1 is equal to the timing TSON, the program proceeds to step S370 at which the electronic valve 80A is opened. On the other hand, when the value on T1 is not equal to the timing TSON, the program skips step S370 and proceeds to step S380. Namely, as seen in the timing chart of FIG. 11, supply of new fixer is executed after a predetermined time period elapses since the opening of the electromagnetic valve 80 and before conveyance of the photosensitive material PM into the fixation tank 96A.

At step S380, it is judged whether the value of the flag F representing exposure is 'one'. Since exposure is started and the flag F is set to 'one' at step S320, the answer at step S380 is 'YES' and the program proceeds to step S390 at which it is judged whether the exposure process is completed. When the holder 10 is transported by a distance corresponding to the length of the original and necessary exposure is completed, processing required for conclusion of exposure is executed at step S400. The processing at step S400 includes: returning the holder 10 to the initial position; stopping the conveyance of the photosensitive material PM; and cutting the photosensitive material PM at the end of the exposed region by the cutting device 27.

After the processing at step S400, the flag F is reset to zero representing completion of exposure at step S410. A second timer counter T2 of the timer 168 is then initialized to zero so as to start counting the time from conclusion of exposure at step S420.

In the above embodiment, the original has a certain length and the end of the photosensitive material PM reaches the fixation tank 96A before conclusion of exposure. The original, however, may be short and the photosensitive material PM may not reach the fixation tank 96A at the conclusion of exposure. In the latter case, step S390 gives a positive answer prior to that at step S360. Namely, counting on the second timer counter T2 starts before the electromagnetic valve 80A is opened.

After the start of the timer counter T2 at step S420, the value on the timer counter T2 is compared with a close timing of the electromagnetic valve 80 TAOFF at step S430. When the value T2 is less than the timing TAOFF, the program returns to step S360 and repeats steps S360 through S430. On the other hand, when the value T2 is equal to the timing TAOFF, the program proceeds to step S440 at which the electromagnetic valve 80 is closed.

The close timing TAOFF is judged to give a sufficient time interval to supply new developer through the developer supply roller 98 for development of the photosensitive material PM in the process tank 96. As clearly seen in the timing chart of FIG. 11, the electromagnetic valve 80 is closed after conclusion of exposure and before the whole length of the exposed photosensitive material PM goes out of the process tank 96.

After the opening of the electromagnetic valve 80 or when the value on the timer counter T2 becomes greater than the timing TAOFF, the program proceeds to step S450 at which the value of the timer counter T2 is compared with a close timing of the electromagnetic valve 80A TSOFF. When the value on T2 is less than the timing TSOFF, the program returns to step S360 and repeats steps S360 through S450. On the other hand, when the value on T2 is equal to or greater than the timing TSOFF, the electromagnetic valve 80A is closed at step S460.

The close timing TSOFF is determined to give a sufficient time interval to supply fixer through the fixer supply roller 98A for fixation of the photosensitive material in the fixation tank 96A. As clearly seen in the timing chart of FIG. 11, the electromagnetic valve 80A is closed before the whole length of the exposed photosensitive material PM goes out of the fixation tank 96A.

After closing the electromagnetic valve 80A, the electronic control unit 60 waits for a time period T3 until the photosensitive material PM passes through the dry unit 50 at step S470 and turns off elements of the camera 1 including the dry unit 50 and the drive motor 180 at step S480. The program then returns to the waiting routine of FIG. 8 and repeats the processing from the beginning.

In the apparatus of the embodiment, the following processes are successively executed: transport of the original held in the holder 10; exposure of the photosensitive material PM by the optical projection system 30; conveyance of the photosensitive material PM synchronized with the transport of the holder 10; development and fixation in the processor 40; cutting of the photosensitive material PM by the cutting device 27; and drying of the photosensitive material PM by the dry unit 50. The exposed photosensitive material PM exposed by the optical projection system 30 is developed in the process tank 96, fixed in the fixation tank 96A, dried by the dry unit 50, and fed out to the external tray 56 outside the camera casing 2. The plate for offset printing is accordingly obtained.

As described above, the processor 40 incorporated in the slit exposure process camera 1 uniformly supplies developer and fixer through rotation of the developer supply roller 98 and the fixer supply roller 98A to the process tank 96 and the fixation tank 96A. The photosensitive material PM conveyed into the tanks 96 and 96A is uniformly and stably developed and fixed by the newly supplied processing solutions. The new developer is supplied to the inlet area of the photosensitive material PM; namely, the photosensitive material PM is developed with new developer at the initial stage of development. The photosensitive material PM is thus developed efficiently and stably.

Development and fixation of the photosensitive material PM with the newly supplied processing solutions in the tanks 96 and 96A continue while the photosensitive material PM is taken out of the tanks 96 and 96A and conveyed along the guide plates 110 and 110A. Hence smaller volumes of the processing solutions are sufficient to be stored in the tanks 96 and 96A. Development and fixation of the photosensitive material PM are sufficiently accomplished even when the photosensitive material PM passes through the tanks 96 and 96A in a short time period. Namely, the photosensitive material PM can be conveyed at a relatively high speed. Furthermore, the tanks 96 and 96A, the processor 40, and thereby the slit exposure process camera 1 can be made smaller in size.

The above embodiment does not require large volumes of developer and fixer, thus preventing poor or unstable quality of development due to deterioration and oxidation of developer in the process tank 96 and improving the quality of reproduction. The volume of the processing solution required for development or fixation is also efficiently reduced. The smaller volume of developer efficiently prevents sludge accumulation on the bottom of the tank 96. Accordingly, time- and labor-consuming washing and cleaning of the tank 96 are not required. Non-accumulation of sludge on the bottom of the process tank 96 allows smooth conveyance of the photosensitive material PM, thus preventing uneven development of the photosensitive material PM.

At the beginning of operation of the slit exposure process camera 1, used developer and fixer are discharged from the process tank 96 and the fixation tank 96A via the bottom reserve chambers 101 and 101A. Sludge in processing solutions is readily drained together with the used processing solutions. Washing and any troublesome maintenance is not required for the process tank 96. Without washing the process tank 96, the camera 1 is free from maintenance.

The smaller developer stored in the process tank 96 is heated by the heater bars 103 in the bottom reserve chamber 101. Namely, developer in the reservoir 95 for developing the photosensitive material PM is warmed to a predetermined temperature range within a short time period. The apparatus does not require warm-up time for temperature adjustment and saves electricity or energy.

Developer supplied from the developer nozzle 82 spreads along the axis of the developer supply roller 98 that is, the width of the photosensitive material PM, and is collected in the basin 143. The new developer collected in the basin 143 is held in the pores on the surface of the developer supply roller 98 and transferred to the reservoir 95 with rotation of the developer supply roller 98. The new developer held in the pores slowly diffuses into the developer stored in the reservoir 95 and does not cause rough surface of developer in the reservoir 95. Uneven development (irregular and undesirable lines observed on the photosensitive material PM) due to rough surface of developer is efficiently prevented.

An apparatus for processing photosensitive material according to a second embodiment of the invention is now described in detail. The second embodiment has different structure for limited portions including a feed system of photosensitive material. Other elements including the process tank and the optical projection unit 30 are similar to those of the first embodiment and thereby not described here. Similar elements to those of the first embodiment have the same numerals and symbols.

Figure 12:
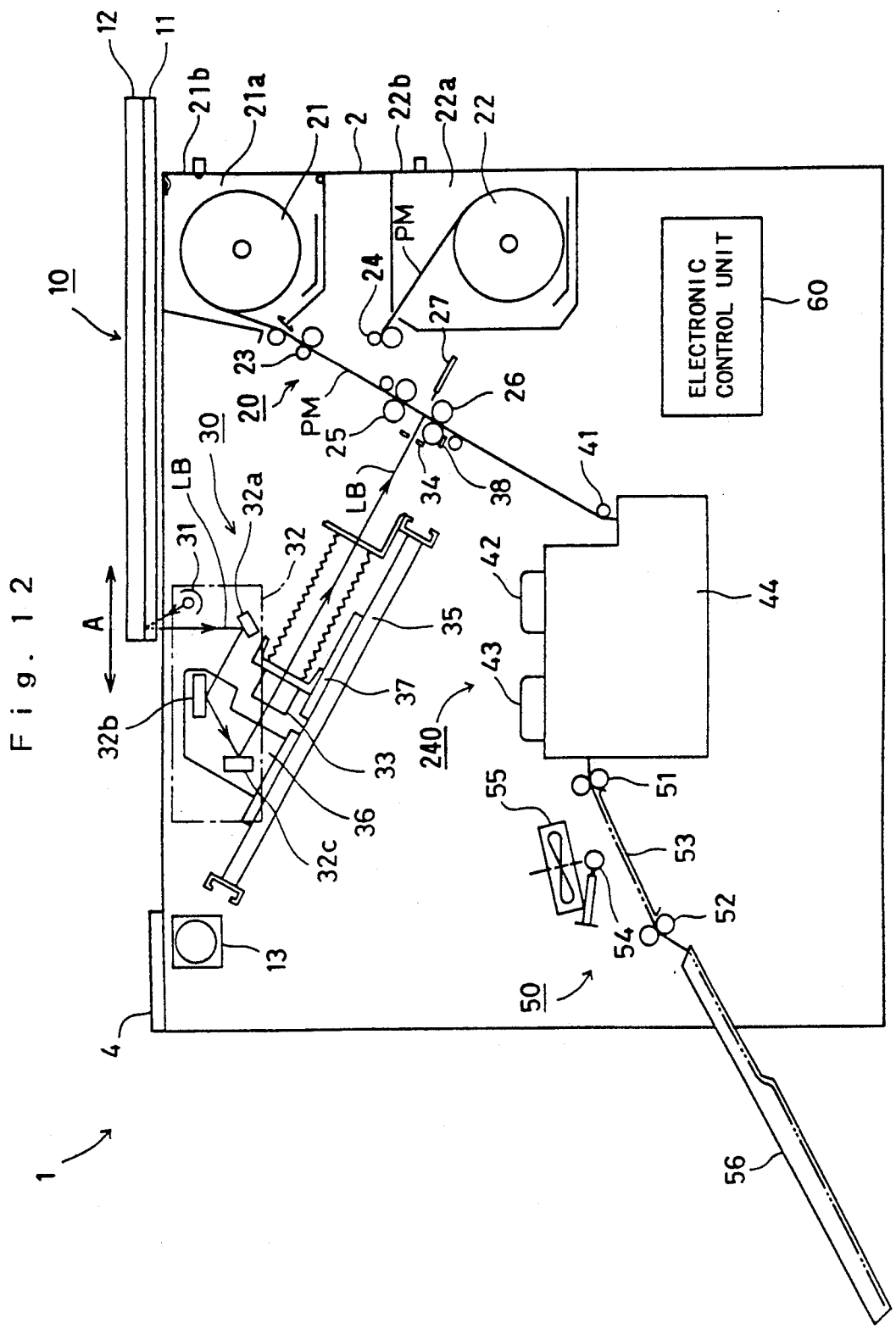
FIG. 12 is a schematic view showing a slit exposure process camera 1 including a processor of a second embodiment according to the invention.
Figure 13:
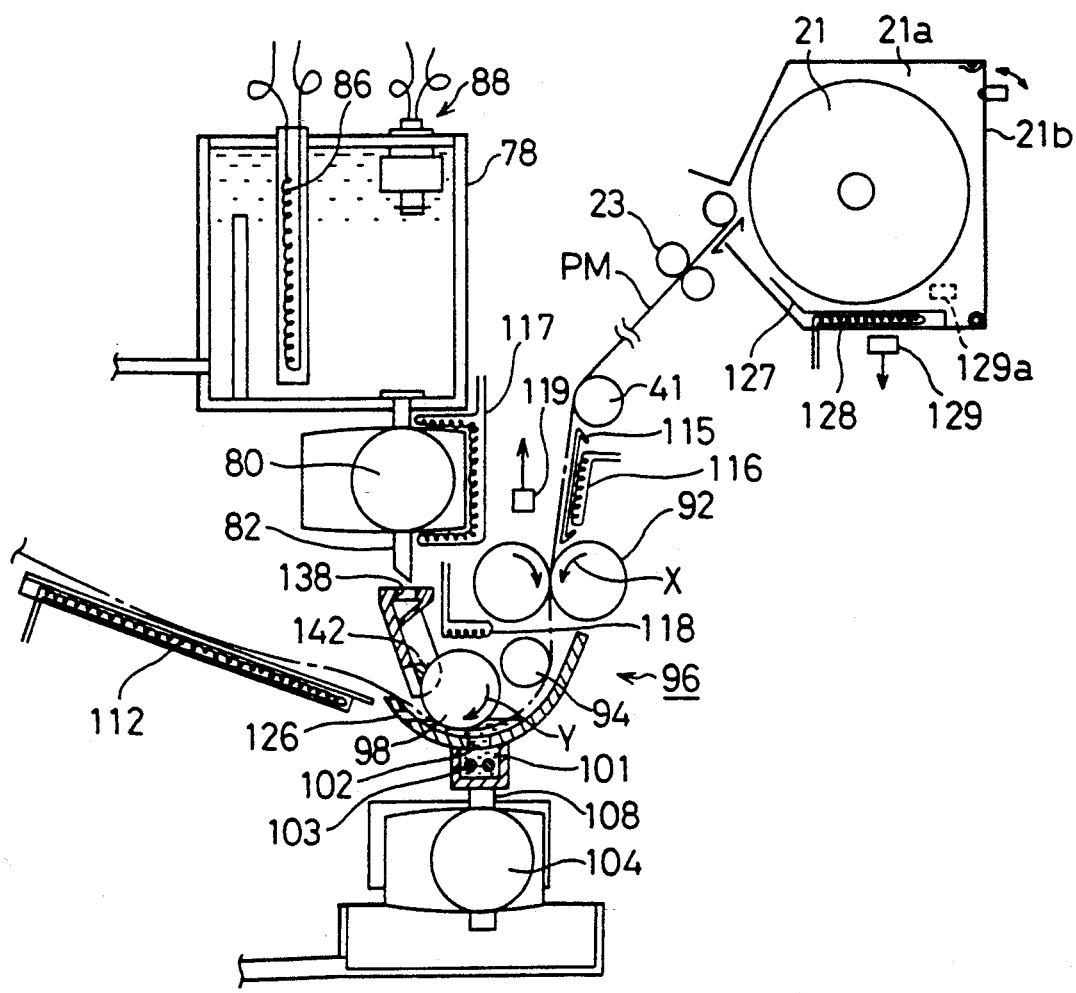
FIG. 13 is a cross sectional view illustrating the arrangement of rollers, a temporary reservoir 100, and heaters with a process tank 96.

FIG. 12 is a schematic view illustrating a slit exposure process camera 201 with a processor 240. FIG. 13 is a cross sectional view showing part of the processor 240 for developing and fixing photosensitive material PM.

A photosensitive material transport unit 20 includes a first roll of photosensitive material 21 and a second roll of photosensitive material 22, which are respectively stored in a first master chamber 21a and a second master chamber 22a as shown in FIG. 12. The first and the second master chambers 21a and 22a are formed as partitions in a camera casing 2. A shaft is fitted and fixed at predetermined positions on both side walls of each of the master chambers 21a and 22a. The rolls 21 and 22 are set in the chambers 21a and 22b in the following manner. After a door 21b or 22b of the master chamber 21a or 22a is opened, the shaft is detached, rotatably inserted in the first roll 21 or the second roll 22, and refitted and fixed at the predetermined position. The rolls 21 and 22 may respectively be held in a specially designed magazine.

The processor 240 includes several heaters other than a panel heater 112 in the vicinity of a process tank as shown in FIG. 13. The processor 240 includes: a first preheater 116 mounted along a guide 115 disposed between a guide roller 41 and a pair of feed rollers 92; a second preheater 117 surrounding an electromagnetic valve 80, a passage 79, and a developer nozzle 82; and a third preheater 118 in the vicinity of a developer supply roller 98 on a process tank 96. A thermistor 119 for detecting the temperature of atmosphere is disposed in the vicinity of the guide 115 facing the photosensitive material PM. The preheaters 116, 117, 118, and the thermistor 119 are connected to an electronic control unit 260 (described later) and preliminary heat the photosensitive material PM.

Each of the first and the second master chambers 21a and 22a for storing the first roll 21 and the second roll 22 is also provided with a preheater. Although FIG. 13 shows only the first master chamber 21a, the second master chamber 22a has similar construction to the first chamber 21a. A forth preheater 128 is disposed inside a partition 127 formed on the lower portion of the first master chamber 21a. The temperature in the master chamber 21a heated by the preheater 128 is detected by a thermistor 129 disposed below the master chamber 21a. The thermistor 129 is disposed at a position where it is not directly influenced by the forth preheater 128 since the roll 21 or 22 has a large thermal capacity. That is, the position of the thermistor 129 is judged to ensure sufficient preheating of the roll 21 or 22 in the first or the second master chamber 21a or 22a. Alternatively, a thermistor 129a shown by the broken line of FIG. 13 may be disposed in the first master chamber 21a or the second master chamber 21b to detect the temperature in the chamber.

Figure 14:
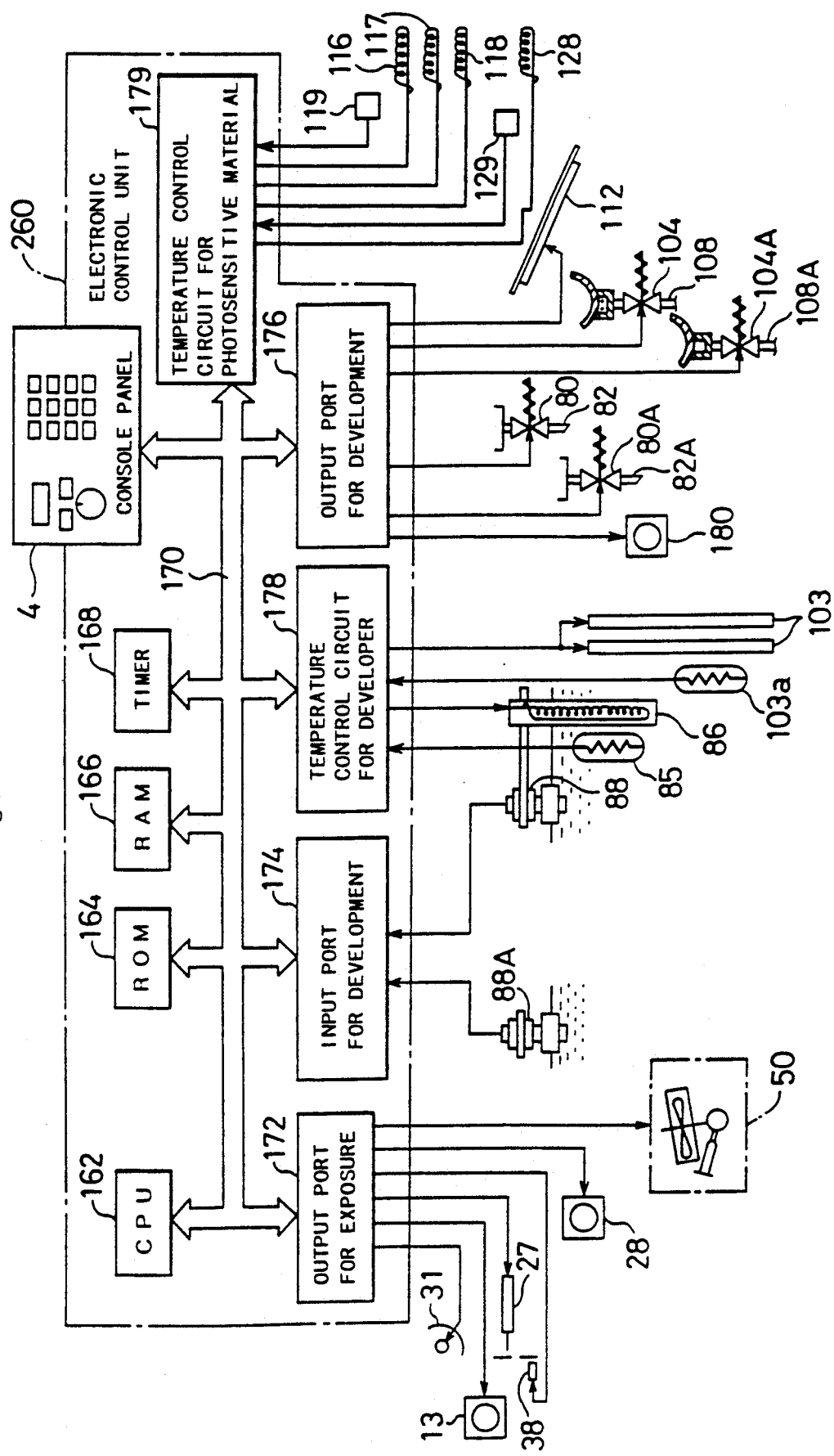
FIG. 14 is a block diagram showing structure of an electronic control unit 60 in the slit exposure process camera of the second embodiment.

The electronic control unit 260 of the slit exposure process camera 1 shown in FIG. 14 includes a CPU 162, a ROM 164, a RAM 166, a timer 168, an output port for exposure 172, an input port for development 174, an output port for development 176, a temperature control circuit 178, and another temperature control circuit 179 for controlling the temperature of the photosensitive material PM in the first and the second master chambers 21a and 22a and in the vicinity of the process tank 96.

The temperature control circuit 179 is connected to: the first preheater 116, the second preheater 117, the third preheater 118, the forth preheaters 128 in the master chambers 21a and 22a, the thermistor 119 for detecting the temperature in the vicinity of the process tank 96, and the thermistor 129 for detecting the temperature of the photosensitive materials PM in the master chambers 21a and 22a. The temperature control circuit 179 preliminarily heats the photosensitive material PM fed from the master chamber 21a or 22a to the process tank 96 prior to development and outputs a signal representing conclusion of the preheating to the CPU 162.

The electronic control unit 260 executes the initial processing routine of FIG. 7, the waiting routine of FIG. 8, and the exposure/development routine of FIG. 9. At step S90 of the initial processing routine, the electronic control unit 260 outputs a signal to the temperature control circuit 179 to actuate the first to forth preheaters 116, 117, 118, and 128 and start preheating of the photosensitive material PM as well as a signal to the temperature control circuit 178 to start temperature control of developer in an developer cistern tank 78 and the process tank 96.

At the following step S100, conclusion of the preheating of the photosensitive material PM is judged as well as conclusion of the temperature control of developer and the panel heater 112. In winter, when the photosensitive material PM is cold, the first and the second master chambers 21a and 22a are sufficiently heated to warm the first and second rolls 21 and 22. The photosensitive material PM is warmed with the preheaters on the basis of the temperature of the photosensitive material PM detected by the thermistors 119 and 129. Exposure and development of the photosensitive material are not executed until the first or the second roll 21 or 22 is sufficiently warmed to an appropriate temperature range (26 through 32 degrees centigrade for the photosensitive material PM).

When the temperature control of developer and the panel heater 112 is concluded and sufficient rise of the temperature on the roll of the rolls 21 or 22 of photosensitive material and in the vicinity of the process tank 96 are detected by the thermistors 119 and 129, the program proceeds to step S110 at which conclusion of warm-up is displayed on the console panel 4. The program then exits from the initial processing routine and goes to the waiting routine and further to the exposure/development routine.

As described above, in the processor 240 incorporated in the slit exposure process camera 1, new developer or fixer is uniformly supplied to the inlet of the photosensitive material PM in the process tank 96 or the fixation tank 96A. The photosensitive material PM conveyed into the process tank 96 or the fixation tank 96A is uniformly and stably developed or fixed with the supplied processing solution. Furthermore, the photosensitive material PM taken out of the process tank 96 or the fixation tank 96A continues reaction with the processing solution. Hence a smaller volume of developer or fixer stored in the tank 96 or 96A is sufficient for developing or fixing silver salt photosensitive material for direct plate making. The tanks 96 and 96A, the processor 40, and thereby the slit exposure process camera 1 can be made smaller. The second embodiment has additional effects besides those of the first embodiment.

The photosensitive material PM is sufficiently warmed, prior to development and fixation, in the first and the second master chambers 21a and 22a and further warmed by the first preheater 116 while being conveyed along the guide 115. Since a roll of the photosensitive material PM has a large thermal capacity, preliminary heating thereof in the master chambers 21a and 22a preferably keeps the photosensitive material conveyed warm. Developer newly supplied to the process tank 96 via the electromagnetic valve 80 is warmed by the second preheater 117 while the vicinity of the developer supply roller 98 is heated by the third preheater 118. The temperature of developer carried on the developer supply roller 98 and supplied to the process tank 96 is efficiently maintained in an adequate range. Both the photosensitive material PM and developer are kept sufficiently warm for stable development even in winter or cold weather.

Figure 15:
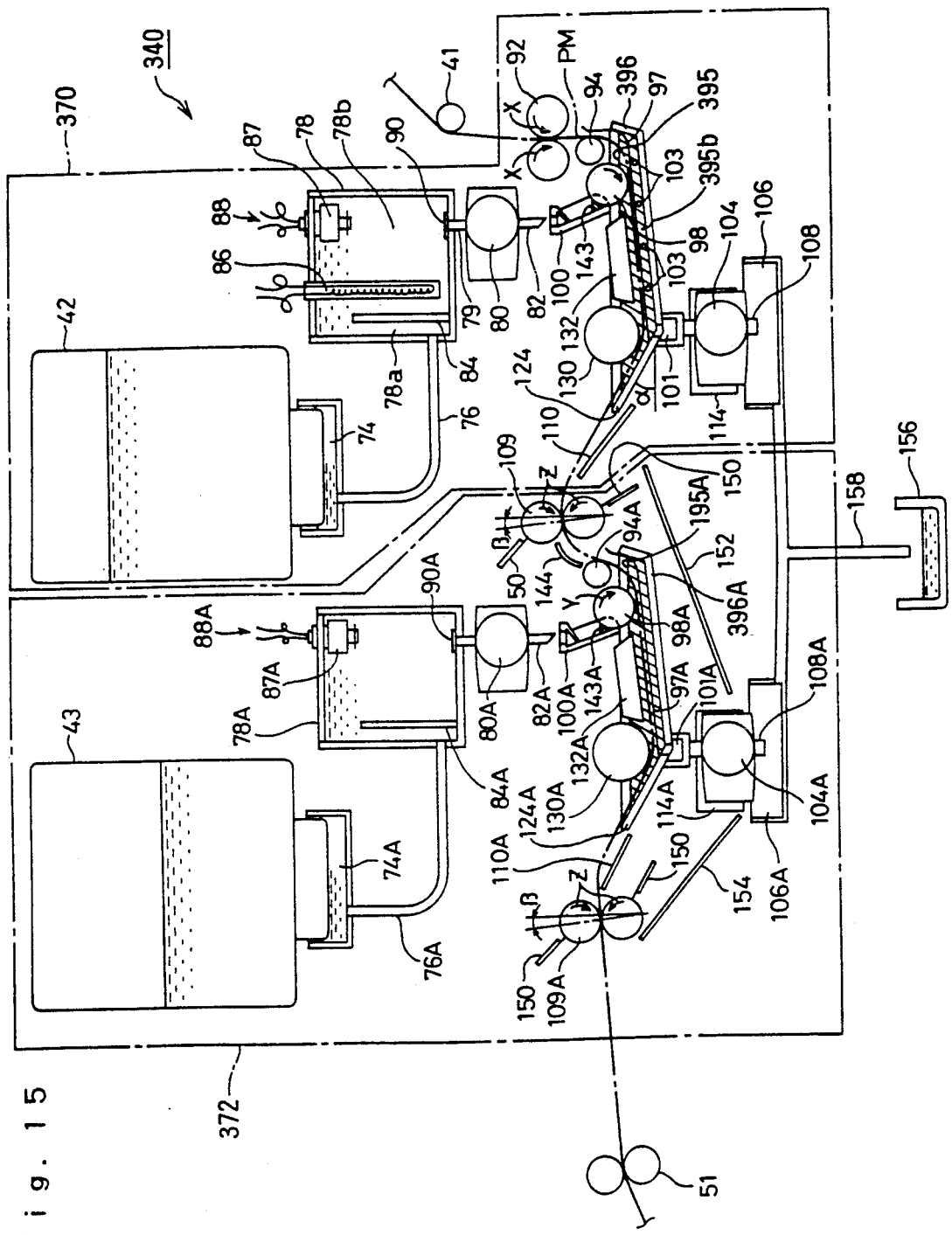
FIG. 15 is a schematic view showing a processor of a third embodiment according to the invention.

An apparatus for processing photosensitive material according to a third embodiment of the invention is now described. FIG. 15 is a schematic view illustrating a processor 340 of the third embodiment. The processor 340 includes a development unit 370 and a fixation unit 372 which are different from those of the processor 40 shown in FIG. 2.

Figure 16:
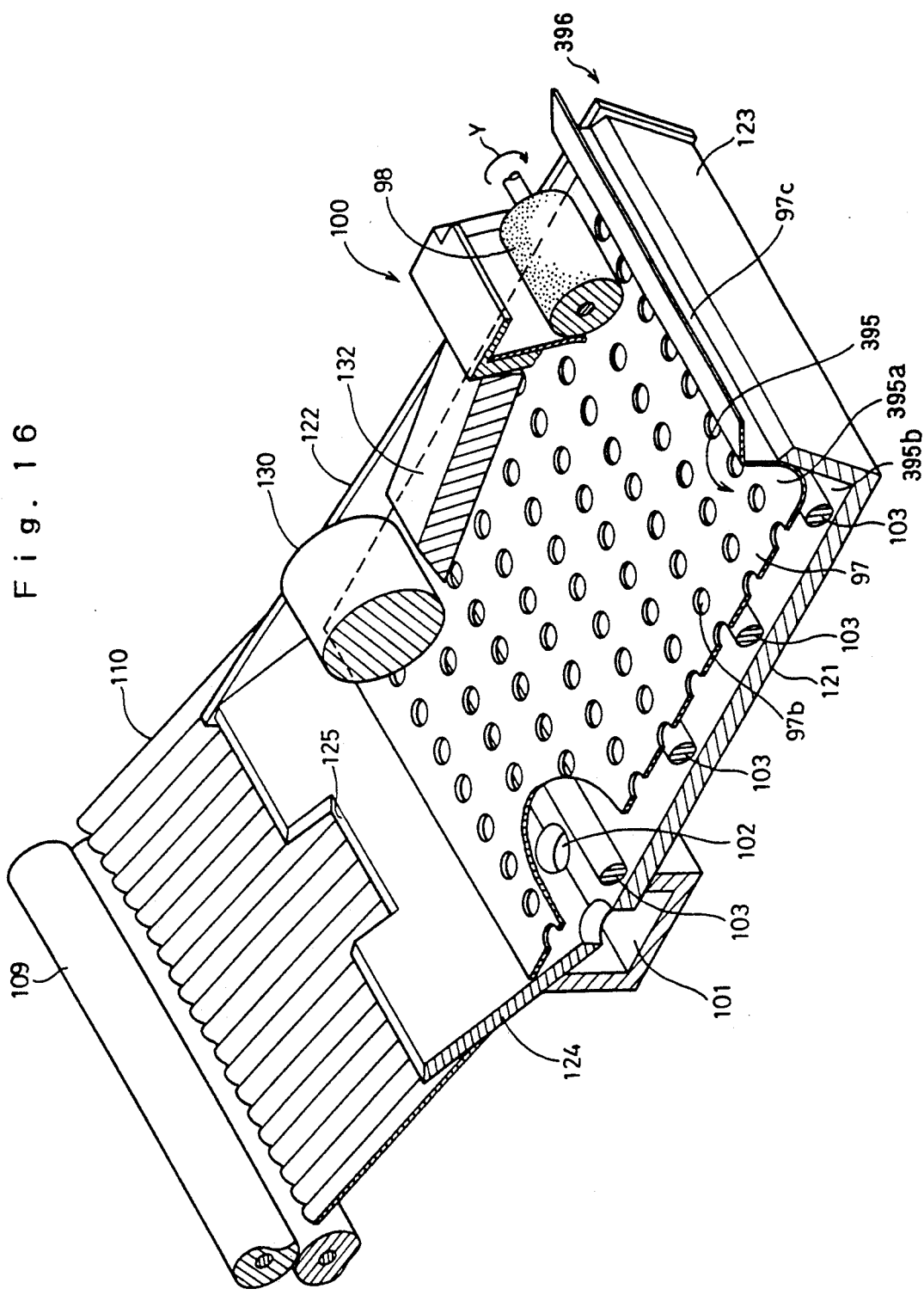
FIG. 16 is a perspective view illustrating a process tank 196.
Figure 17:
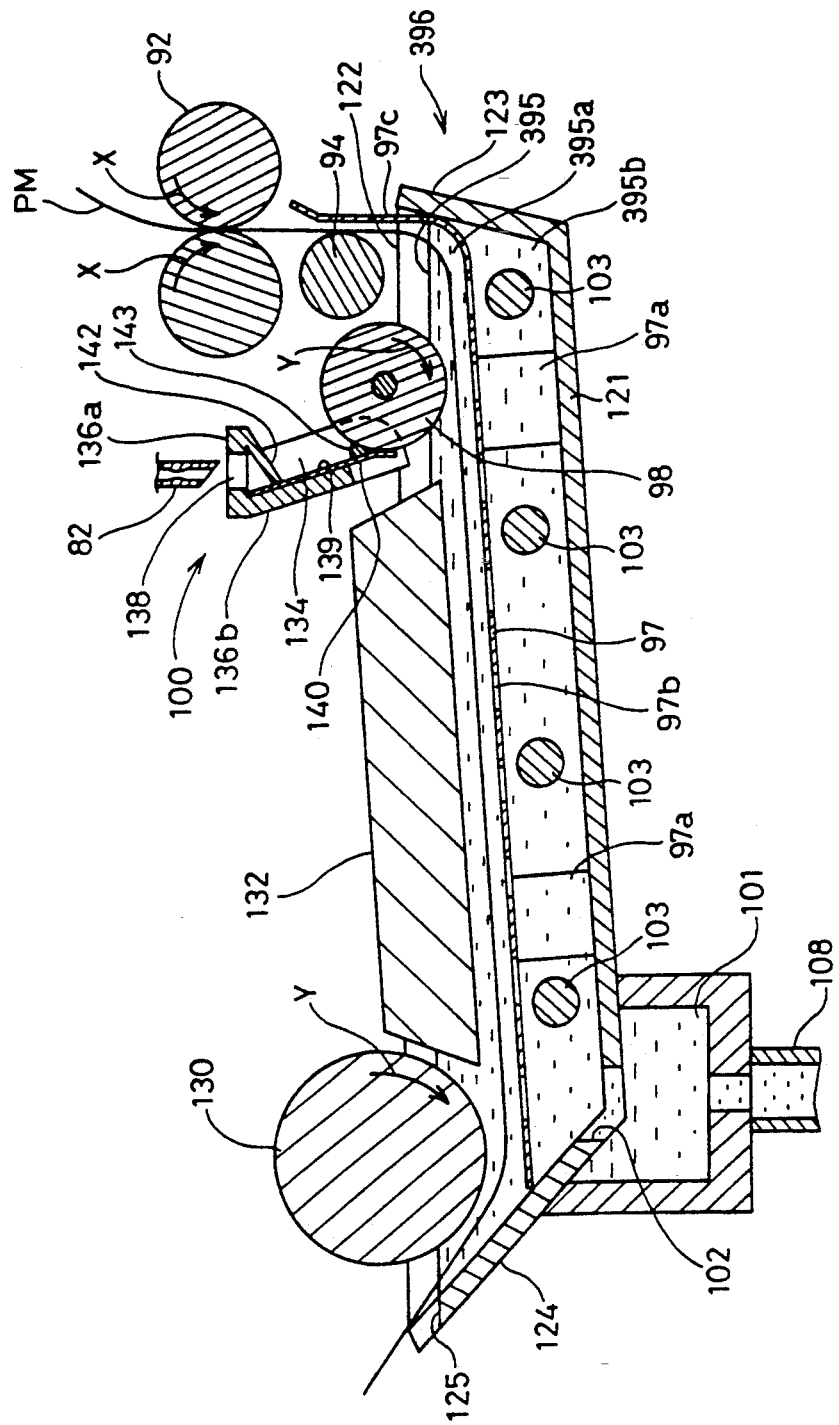
FIG. 17 is a cross sectional view illustrating the arrangement of a supply roller 98 and a temporary reservoir 100 with the process tank 196.

Unique structure of the third embodiment is described in detail based on FIGS. 15 through 17. FIGS. 16 and 17 are a perspective view and a cross sectional view illustrating a process tank 396, respectively. Similar elements to those of the first embodiment have the same numerals and symbols.

Photosensitive material PM is conveyed through a guide roller 41 and a pair of feed rollers 92 into the process tank 396, which is a plate-like tank with an inclined bottom, has a width corresponding to that of the photosensitive material, and includes a reservoir 395 for storing developer as seen in FIG. 16. A partition 97 is supported by legs 97a and mounted parallel to the bottom of the reservoir 395 in the process tank 396 as shown in FIGS. 16 and 17. The partition 97 divides the reservoir 395 between an upper reserve chamber 395a and a lower reserve chamber 395b, which are connected to each other via plural apertures 97b formed in the partition 97. The front end of the partition 97 forms a guide side wall 97c, which is bent upward to the feed roller pair 92 and disposed opposite to a free roller 94.

A developer supply roller 98 extending to the width of the process tank 396 is disposed at a short distance from the partition 97. When developer is stored in the reservoir 395 of the process tank 396, the partition 97 is submerged in the developer and the lower portion of the developer supply roller 98 is soaked in the developer in the upper reserve chamber 395a.

Structure of the developer supply roller 98 and of the periphery is the same as that of the first embodiment.

An auxiliary roller 130 extending to the width of the process tank 396 is disposed on the opposite side of the process tank 396 at a short distance from the partition 97. The auxiliary roller 130 rotates synchronously with and in the same direction as the developer supply roller 98 to convey the photosensitive material PM. When developer is stored in the reservoir 395 of the process tank 396, part of the lower portion of the auxiliary roller 130 is also soaked in the developer in the upper reserve chamber 395a. A trapezoid wave dissipation plate 132 extending to the width of the process tank 396 is disposed between the developer supply roller 98 and the auxiliary roller 130. The wave dissipation plate 132 is mounted at a short distance from the partition 97 and is partly soaked in developer in the upper reserve chamber 395a.

A bottom reserve chamber 101 is formed below the process tank 396 and connected thereto through plural apertures formed on the bottom of the process tank 396. Four heater bars 103 for heating developer are disposed inside the lower reserve chamber 395b separated by the partition 97. A discharge pipe 108 formed below the center of the bottom reserve chamber 101 is connected to the bottom reserve chamber 101 via an electromagnetic valve 104 for opening and closing the discharge pipe 108, and drains used developer into a waste tray 106.

An inclined guide plate 110 is disposed on the outlet of the photosensitive material PM in the process tank 396, and feeds the developed photosensitive material PM to a pair of wring rollers 109 of the fixation unit 372. The guide plate 110 is corrugated so as to decrease the contact resistance to the photosensitive material PM (see FIG. 16).

The process tank 396 includes: a bottom plate 121, an inlet end plate 123, and an outlet end plate 124, which are integrally formed of a stainless steel plate; and side plates 122 (the left side plate is omitted in FIG. 16), which are joined and fixed to the plates 121, 123, and 124, respectively. The bottom plate 121 slopes from the bent of the inlet end plate 123 to the bent of the outlet end plate 124. The plural apertures 102 are formed on the bent between the bottom plate 121 and the outlet end plate 124. A notch window 125 is formed near the center of the outlet end plate 124.

In the process tank 396, the outlet end plate 124 is inclined at an angle of elevation α as seen in FIG. 15. The bent between the bottom plate 121 and the outlet end plate 124 and thereby the apertures 102 are positioned on the lowermost part of the process tank 396.

Since the lower portion of the developer supply roller 98 is soaked in developer stored in the process tank 396, new developer drawn out with rotation of the developer supply roller 98 is added to the developer stored in the reservoir 395. New developer is uniformly distributed (diffused) across the width of photosensitive material (PM) in the vicinity of the inlet of the photosensitive material PM in the process tank 396. While the newly supplied developer increases the level of developer in the reservoir 395, a certain volume of used developer is discharged from the notch window 125 of the outlet end plate 124. The volume of developer discharged is determined by subtracting a portion lost by conveyance of the photosensitive material PM from the volume of newly supplied developer. Hence the level of developer is maintained constant in the process tank 396. The notch window 125 and the guide plate 110 are so disposed that developer does not drip on the guide plate 110.

Developer stored in the lower reserve chamber 395b is heated by the four heater bars 103 disposed therein. The warmed developer is circulated from the lower reserve chambers 395b to the upper reserve chambers 395a through the apertures 97b of the partition 97. Supply of electricity to the heater bars 103 is controlled based on feed-back data on the temperature of developer. Accordingly, developer in the process tank 396 is heated within a short time interval and maintained in a predetermined temperature range.

Sludge flowing into the bottom reserve chamber 101 through the apertures 102 of the bottom plate 121 in the process tank 396 is discharged, together with used developer kept in the bottom reserve chamber 101, into the waste tray 106 via the discharge pipe 108 when the electromagnetic valve 104 is opened.

Conveyance of the photosensitive material PM is described. The exposed photosensitive material PM fed by the pair of feed rollers 92 is conveyed along the free roller 94 into the reservoir 395, and passes through developer in the upper reserve chamber 395a along the inner face of the partition 97. Development of the photosensitive material PM is completed while the material PM passes through the upper reserve chamber 395a. Reaction with developer or development starts when the photosensitive material PM is inserted in the upper reserve chamber 395a, proceeds while the photosensitive material PM travels between the partition 97 and the wave dissipation plate 132, then between the partition 97 and the auxiliary roller 130, and is concluded when the photosensitive material PM is taken out of the reservoir 395. The photosensitive material PM is then conveyed along the inner face of the inclined outlet end plate 124 and the guide plate 110 to the pair of wring rollers 109 of the fixation unit 372. Excess of developer in which the surface of the photosensitive material PM is drenched, is efficiently wrung out and removed by the pair of wring rollers 109 disposed.

The fixation unit 372 for fixing the photosensitive material PM includes a fixation tank 396A and peripheral elements which are different from the first embodiment. The structure of the fixation tank 396A is, however, similar to that of the process tank 396 except heater bars 103, and is thus not described here. Conveyance of the photosensitive material PM through the fixation unit 372 is briefly explained.

The photosensitive material PM fed from the development unit 370 is wrung by the pair of wring rollers 109, and is conveyed along a free roller 94A into a reservoir 395A. Reaction with fixer or fixation starts when the photosensitive material PM is inserted into fixer in the reservoir 395A, and is concluded when the photosensitive material PM is taken out of the reservoir 395A. The photosensitive material PM is then conveyed along the inner face of an outlet end plate 124A and the upper face of a guide plate 110A of the fixation tank 396A to a pair of wring rollers 109A. After excess of fixer is wrung out of the photosensitive material PM, the photosensitive material PM is further conveyed to a dry unit 50 via a pair of rollers 51.

The electric structure of the slit exposure process camera of this embodiment is similar to that of the first embodiment except the number of the heater bars 103. The initial processing routine of FIG. 7, the waiting routine of FIG. 8, and the exposure/development routine of FIG. 9 are executed as in the first embodiment. Some steps are, however, modified since the process tank 396 has a different structure from that of the first embodiment.

In the initial processing routine of the third embodiment, waiting time intervals at steps S20 and S60 are set longer than those of the first embodiment corresponding to the volume of the process tank 396.

In the exposure/development routine, the close timing of the electromagnetic valve 80 at step S440 is different from that of the first embodiment. The close timing TAOFF is determined to give a sufficient time interval to supply new developer through the developer supply roller 98 for development of the photosensitive material PM in the process tank 396. Since the process tank 396 has a predetermined length in the direction of conveyance of the photosensitive material PM, the electromagnetic valve 80 is closed a relatively long time before the rear end of the exposed photosensitive material PM is taken out of the process tank 396 as clearly seen in a timing chart of FIG. 18. The photosensitive material PM reacts with newly supplied developer immediately after the material PM is soaked in the reservoir 395. Reaction or development continues while the photosensitive material PM is conveyed through developer stored in the reservoir 395, and is concluded when the material PM is taken out of the process tank 396.

The close timing of the electromagnetic valve 80A at step S460 is also different from that of the first embodiment. The close timing TSOFF, as the close timing TAOFF of the electromagnetic valve 80 of the development unit 70, is determined to give a sufficient time interval to supply new fixer through a fixer supply roller 98A for fixation of the photosensitive material PM in the fixation tank 396A. The electromagnetic valve 80A is closed a relatively long time before the rear end of the developed photosensitive material PM is taken out of the fixation tank 396A as clearly seen in a timing chart of FIG. 18. Fixation of the photosensitive material PM is completed while the photosensitive material PM is conveyed through fixer in the fixation tank 396A.

As described above, a processor 340 incorporated in the slit exposure process camera 1 uniformly supplies developer and fixer to the inlet of the photosensitive material PM in the process tank 396 and the fixation tank 396A. Both the process tank 396 and the fixation tank 396A have enough lengths to complete development and fixation. The photosensitive material PM conveyed into the tanks 396 and 396A is uniformly and stably developed and fixed by the newly supplied processing solutions at the initial stage. Furthermore, development and fixation of the photosensitive material PM are completed while the photosensitive material passes through the process tank 396 and the fixation tank 396A. Accordingly, the apparatus of the third embodiment ensures stable and high quality development and fixation of the photosensitive material PM.

The process tank 396 or the fixation tank 396A has a relatively long but shallow passage for the photosensitive material PM. Such structure does not require a large volume of processing solution as the conventional apparatus, and allows silver salt photosensitive material PM for direct plate making to be developed or fixed with a smaller volume of developer or fixer. Accordingly, the tanks 396 and 396A, the processor 340, and thereby the slit exposure process camera 1 can be made smaller in size.

The smaller volume of developer is warmed to a predetermined temperature range within a short time period. The apparatus of the third embodiment does not require warm-up time for the temperature adjustment and saves electricity or energy.

The processor 340 of the embodiment does not require large volumes of developer and fixer, thus preventing poor and unstable development due to deterioration and oxidation of developer and improving the quality of reproduction. The volume of the processing solution required for development or fixation is also efficiently reduced. The smaller volume of processing solution in the tank efficiently shortens the time required for replacement and reduces the working load. The process tank 396 includes the wave dissipation plate 132 partly soaked along the width of the process tank 396, and the area of the liquid surface in contact with the air is relatively small in the upper reserve chamber 395a. Such structure prevents oxidation of the processing solution and allows stable development and fixation, resulting in improved quality of reproduction. The wave dissipation plate 132 keeps the surface of processing solution still in the upper reserve chamber 395a and thereby efficiently prevents uneven development (irregular and undesirable lines observed on the photosensitive material) due to rough surface or wave on the surface.

The smaller volume of processing solution efficiently prevents sludge accumulation on the bottom of the tank 396. Accordingly, time- and labor-consuming washing and cleaning of the tank 396 are not required. Sludge generated in the upper reserve chamber 395a is transferred to the lower reserve chamber 395b via the apertures 97b of the partition 97, and then drops along the bottom plate 121 into the bottom reserve chamber 101 via the apertures 102. Non-accumulation of sludge on the partition 97 of the process tank 396 allows smooth conveyance of the photosensitive material PM, thus preventing uneven development of the photosensitive material PM.

Although the fixation tank 396A includes a partition 97A in the above embodiment, the fixation tank 396A may be without the partition 97A and uses a bottom plate 121A instead since it does not require heater bars 103.

The embodiments described above are not intended to limit the invention to the embodiments but are intended to illustrate the invention more clearly. There may be various modifications and changes without departing from the scope of the invention.

Following are some examples of such modifications and changes: application of the invention to apparatus for performing either development or fixation; a rough polished roller or a porous soft plastic roller instead of the supply roller with a single pore layer; feed-back control for supply of developer on the basis of the developer consumption; replacement of processing solution remaining in the process tank each after processing of a certain area or number of the material as well as the start-up of the apparatus; and application of the invention to processors for silver salt printing paper or reproduction films.

In the above embodiment, the photosensitive material is preliminary heated based on room temperature. Some examples of other systems include: a system that the temperature of the photosensitive material is directly detected by a thermistor or infrared detector; a system that a preheater is incorporated in the guide roller 41 or a spindle rotatably holding a roll of photosensitive material; a system that power supplied to the preheater is controlled on the basis of the temperature of the open air; a system that photosensitive material previously cut in sheets is successively fed out of the master chamber for exposure and development; and a system applied to an apparatus for developing silver salt printing paper or reproduction films.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for processing a succession of silver salt photosensitive materials such as printing paper or photosensitive paper or film for direct plate making, comprising:
   a process tank for storing processing solution for said photosensitive materials;
   feed-in means for conveying said succession of photosensitive material into the processing solution stored in said process tank; and
   first means disposed in the vicinity of an inlet of said photosensitive material in said process tank for supplying new processing solution and distributing same across the width of each of said succession of photosensitive materials.

2. An apparatus in accordance with claim 1, further comprising:
   feed-out means for feeding said succession of photosensitive materials drenched in said processing solution, out of said process tank; and
   conveyance means for conveying said succession of photosensitive material that is fed out of said process tank by said feed-out means, with process solution being maintained on said succession of photosensitive materials for a predetermined time period after said photosensitive material leaves said process tank whereby said succession of photosensitive materials continues being under reaction with said process solution for said predetermined time period.

3. An apparatus in accordance with claim 1, wherein said processing solution stored in said process tank is developer of the photosensitive material.

4. An apparatus in accordance with claim 1, further comprising temperature control means for controlling the temperature of the processing solution supplied to the process tank to a range suitable for processing.

5. An apparatus for processing a succession of silver salt photosensitive materials such as printing paper or photosensitive paper or film for direct plate making, comprising:
- a process tank for storing processing solution for said succession of photosensitive materials;
- supply means for supplying new or unused processing solution to said process tank;
- transport means for conveying said succession of photosensitive materials into said process tank, wherein each of said succession of photosensitive materials is drenched with new or unused processing solution, and feeding said succession of photosensitive materials out of said process tank prior to completion of processing of said photosensitive material with said processing solution;
- remove means downstream of said process tank for removing processing solution with which the surfaces of said succession of photosensitive materials are drenched; and
- first means for sustaining said succession of photosensitive materials under reaction with said processing solution while transferring said succession of photosensitive materials for a predetermined distance along a feed path from said process tank to said remove means.

6. An apparatus in accordance with claim 5, wherein said processing solution stored in said process tank is developer, and said first means includes a temperature control element for controlling temperature along said feed path to a range suitable for reaction of said photosensitive material with said developer.

7. An apparatus for processing a silver salt photosensitive material such as printing paper or photosensitive paper or film for direct plate making, comprising:
- a process tank for storing processing solution for said photosensitive material;
- transport means for conveying said photosensitive material into said process tank and feeding said photosensitive material out of said process tank at a predetermined angle of elevation;
- a pair of rollers, which face each other and are disposed at positions so that they press the photosensitive material fed from said process tank therebetween; and
- remove means for rotating said pair of rollers in the feeding direction of said photosensitive material and removing the processing solution from the surface of said photosensitive material;
- wherein an upper roller of said roller pair is shifted to downstream against the feeding direction of said photosensitive material.

8. An apparatus in accordance with claim 7, wherein a scraper is mounted on the circumference of at least one roller out of said roller pair and scrapes away the processing solution or adhesives such as sludge adhering to the surface of said roller.

9. An apparatus in accordance with claim 7, wherein said transport means comprises a slope member which is inclinatorily disposed between said process tank and said pair of rollers at said predetermined angle of elevation and forms a conveyance passage of the said photosensitive material, said slope member being composed of slidable material or material with small resistance so as to ensure smooth transport of said photosensitive material.

10. An apparatus for processing a succession of silver salt photosensitive materials such as printing paper or photosensitive paper or film for direct plate making, comprising:
- a shallow process tank for storing processing solution for said succession of photosensitive materials;
- feed-in means for conveying said succession of photosensitive materials into the processing solution stored in said process tank; and
- diffusion means disposed in the vicinity of an inlet of said succession of photosensitive materials in said process tank for supplying new processing solution along the respective widths of each of said succession of photosensitive materials; and
- feed-out means for feeding said succession of photosensitive materials out of said process tank after completion of processing of said succession of photosensitive materials with said processing solution.

11. A method for processing a silver salt photosensitive material such as printing paper or photosensitive paper or film for direct plate making, comprising the steps of:
- conveying said photosensitive material into a process tank storing processing solution;
- supplying new or unused processing solution along the width of said photosensitive material to the vicinity of an inlet of said photosensitive material in said process tank prior to feed-in of said photosensitive material;
- feeding said photosensitive material drenched in said processing solution out of said process tank; and
- keeping said photosensitive material under reaction with said processing solution for a predetermined time period.

12. An apparatus for processing a silver salt photosensitive material such as printing paper or photosensitive paper or film for direct plate making, comprising:
- a process tank for storing processing solution for said photosensitive material;
- feed-in means for conveying said photosensitive material into the processing solution stored in said process tank;
- first means disposed in the vicinity of an inlet of said photosensitive material in said process tank for supplying new processing solution and distributing same across the width of said photosensitive material;
- feed-out means for feeding said photosensitive material drenched in said processing solution, out of said process tank; and
- conveyance means for conveying said photosensitive material that is fed out of said process tank by said feed-out means, with process solution being maintained on said photosensitive material for a predetermined time period after said photosensitive material leaves said process tank whereby said photosensitive material continues being under reaction with said process solution for said predetermined time period; said conveyance means being provided with a temperature control element for controlling temperature of a feeding passage provided by said conveyance means for said photosensitive material, to a range suitable for the reaction of said photosensitive material with said processing solution.

13. An apparatus for processing a silver salt photosensitive material such as printing paper or photosensitive paper or film for direct plate making, comprising:
- a process tank for storing processing solution for said photosensitive material, said processing solution being a fixer of the developed photosensitive material;

feed-in means for conveying said photosensitive material into the processing solution stored in said process tank; and first means disposed in the vicinity of an inlet of said photosensitive material in said process tank for supplying new processing solution and distributing same across the width of said photosensitive material.

14. An apparatus for processing a silver salt photosensitive material such as printing paper or photosensitive paper or film for direct plate making, comprising:

a process tank for storing processing solution for said photosensitive material;

feed-in means for conveying said photosensitive material into the processing solution stored in said process tank; and first means disposed in the vicinity of an inlet of said photosensitive material in said process tank for supplying new processing solution and distributing same across the width of said photosensitive material, said first means including:

a roller disposed along the width of said photosensitive material fed into said process tank, and rotatably supported at a position so that a lower portion thereof is soaked in the processing solution stored in said process tank;

reservoir means for temporarily storing new or unused processing solution between said roller and a member pressed against the circumference of said roller along the width thereof; and rotational supply means for rotating said roller in the same direction as the feeding direction of said photosensitive material, and supplying said unused processing solution temporarily stored to said process tank with rotation of said roller.

15. An apparatus in accordance with claim 14, wherein the surface of said roller is made of sponge containing lots of separate pores.

16. An apparatus for processing a silver salt photosensitive material such as printing paper or photosensitive paper or film for direct plate making, comprising:

a process tank for storing processing solution for said photosensitive material;

feed-in means for conveying said photosensitive material into the processing solution stored in said process tank;

first means disposed in the vicinity of an inlet of said photosensitive material in said process tank for supplying new processing solution and distributing same across the width of said photosensitive material, and preheating means for detecting the temperature of said photosensitive material prior to process with said processing solution and preliminary heating said photosensitive material.

17. An apparatus in accordance with claim 16, wherein said preheating means preliminarily heats said photosensitive material at a position where said photosensitive material is stored.

18. An apparatus for processing a silver salt photosensitive material such as printing paper or photosensitive paper or film for direct plate making, comprising:

a process tank for storing processing solution for said photosensitive material;

feed-in means for conveying said photosensitive material into the processing solution stored in said process tank;

first means disposed in the vicinity of an inlet of said photosensitive material in said process tank for supplying new processing solution and distributing same across the width of said photosensitive material;

a groove which is formed in a bottom of said process tank along the width thereof so as to connect to said process tank; and a temperature control unit for controlling the temperature of said process solution.

19. An apparatus in accordance with claim 18, wherein a valve for discharging the processing solution in said process tank is mounted on the passage from said groove.

20. An apparatus for processing a silver salt photosensitive material such as printing paper or photosensitive paper or film for directplate making, comprising:

a shallow process tank for storing processing solution for said photosensitive material;

a member having wave dissipation effect covering the surface of said processing solution stored in said process tank;

feed-in means for conveying said photosensitive material into the processing solution stored in said process tank; and diffusion means disposed in the vicinity of an inlet of said photosensitive material in said process tank for supplying new processing solution along the width of said photosensitive material; and feed-out means for feeding said photosensitive material out of said process tank after completion of processing of said photosensitive material with said processing solution.

* * * * *